(12) United States Patent
Lovell

(10) Patent No.: US 6,900,746 B1
(45) Date of Patent: May 31, 2005

(54) ASYNCHRONOUS, DATA-ACTIVATED CONCATENATOR FOR VARIABLE LENGTH DATUM SEGMENTS

(75) Inventor: William S. Lovell, Lincoln City, OR (US)

(73) Assignee: Wend LLC, Lincoln City, OR (US)

(*) Notice: Subject to any disclaimer, the term of this patent is extended or adjusted under 35 U.S.C. 154(b) by 0 days.

(21) Appl. No.: 10/746,609

(22) Filed: Dec. 23, 2003

(51) Int. Cl.⁷ .............................................. H03M 9/00
(52) U.S. Cl. ........................ 341/100; 341/51; 341/95; 341/63
(58) Field of Search ........................ 341/100, 51, 63, 341/67, 95, 106

(56) References Cited

U.S. PATENT DOCUMENTS

| | | | | |
|---|---|---|---|---|
| 4,122,440 A | * | 10/1978 | Langdon et al. | 341/51 |
| 5,381,144 A | * | 1/1995 | Wilson et al. | 341/63 |
| 5,387,911 A | * | 2/1995 | Gleichert et al. | 341/95 |
| 5,644,306 A | * | 7/1997 | Brent | 341/67 |
| 5,668,598 A | * | 9/1997 | Linzer et al. | 375/240.15 |
| 5,941,938 A | * | 8/1999 | Thayer | 708/490 |
| 6,081,215 A | * | 6/2000 | Kost et al. | 341/120 |
| 6,140,947 A | * | 10/2000 | Livingston | 341/106 |
| 6,208,275 B1 | | 3/2001 | Lovell | |
| 6,518,895 B1 | * | 2/2003 | Weiss et al. | 341/67 |
| 6,580,378 B1 | | 6/2003 | Lovell | |
| 6,765,509 B2 | * | 7/2004 | Jones et al. | 341/51 |

OTHER PUBLICATIONS

U.S Appl. No. 10/462,868, filed Jun. 16, 2003, Lovell.
"Simulators Face Real Problems" By Katie Green Science vol. 301, No. 5631, pp. 301–302 (Jul. 18, 2003).

* cited by examiner

Primary Examiner—Jean Bruner Jeanglaude
(74) Attorney, Agent, or Firm—William S. Lovell

(57) ABSTRACT

An apparatus accepts randomly arriving blocks of parallel digital data of varying bit lengths termed datum segments that may have been generated by stripping leading zeros from bytes of a fixed size, each having associated therewith a bit count code that expresses the bit length of each datum segment in the form nnnnnddd..., the "n" being the bits of the bit count code in such number as to encompass the memory capacity of a receiving device to which the datum segments are to be sent, and the "d" representing the actual datum segment bits. The apparatus concatenates the nnnnnddd... expressions to form a continuous bit sequence that is saved so that each nnnnnddd... expression is accessible thereafter through the computer address therefor, such use preferably being by a circuit of matching bit length, the format, however, allowing the original form of the data to be recovered if desired.

10 Claims, 7 Drawing Sheets

Fig. 1
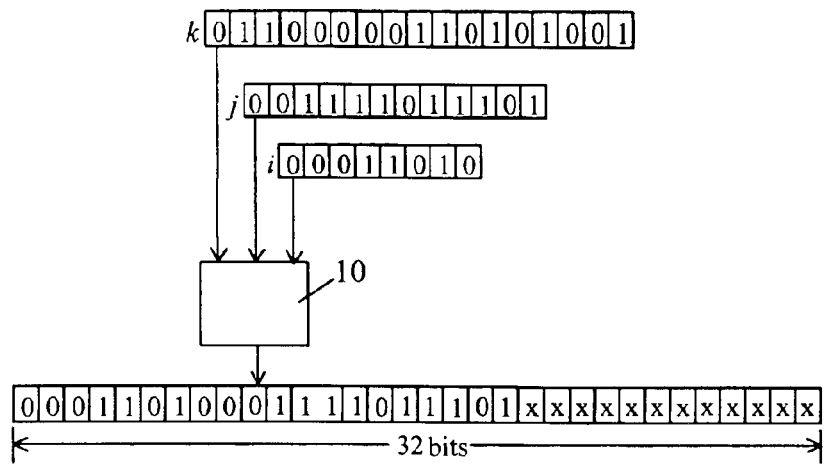
Fig. 2
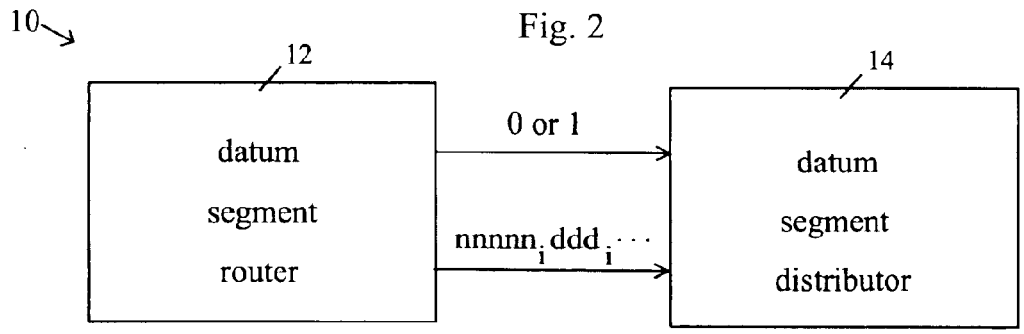
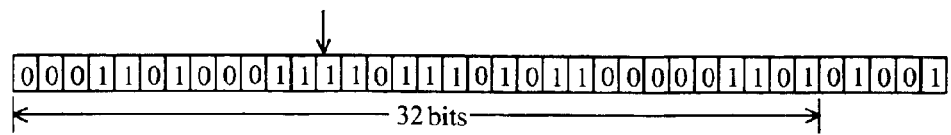

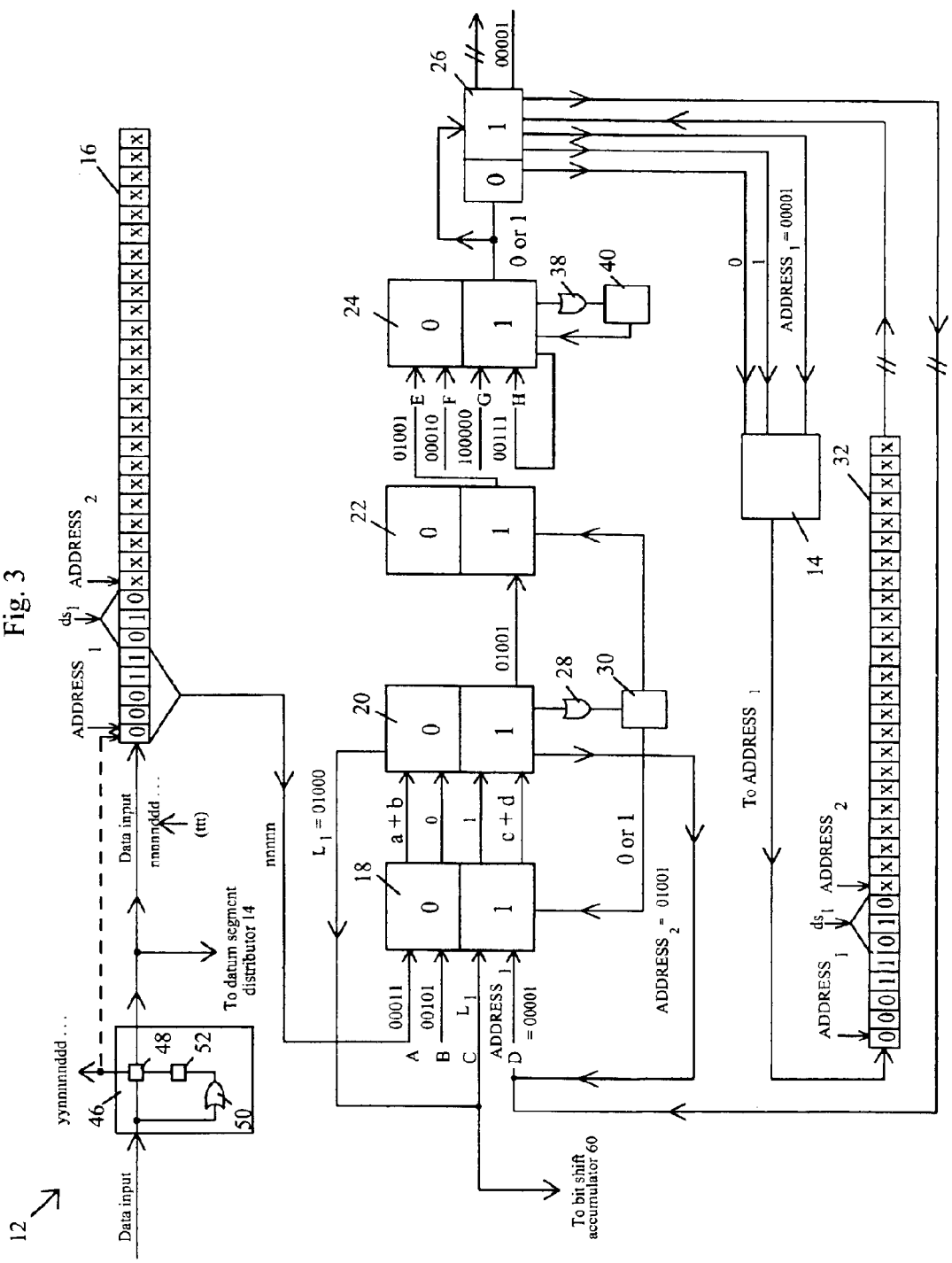

ASYNCHRONOUS, DATA-ACTIVATED CONCATENATOR FOR VARIABLE LENGTH DATUM SEGMENTS

CROSS REFERENCE TO RELATED APPLICATIONS

This application claims the priority of co-pending application Ser. No. 10/462,868 filed on Jun. 16, 2003.

STATEMENT REGARDING FEDERALLY SPONSORED RESEARCH OR DEVELOPMENT

Not applicable.

BACKGROUND OF THE INVENTION

1. Field of the Invention

This invention relates to methods and apparatus for improving the efficiency in the use of and data transmission to, from and within the circuitry of computers, ASICs, optical devices, and other devices that are adapted to accept and operate on serial and parallel binary digital data, and specifically to such data in the form of datum segments that may vary in length and, among other forms, can be expressed by the formula nnnnnddd . . . , where the n's represent the binary code that expresses the bit length of the datum segment ddd . . . , the data so formed also providing security against the compromising of data.

2. Description of the Related Art

In the development of the computer art, data transfer has long been a critical issue. The speed of what would appear to be the fastest computer at present, as noted by Katie Greene in "Simulators Face Real Problems," *Science*, Vol. 301, No. 5631, pp. 301–302 (18 Jul. 2003), is reported to be 35,860 gigaflops, but advances beyond that speed are said to be limited by the need to wait for data on which to operate. Two of the patents previously issued to this inventor, i.e., U.S. Pat. Nos. 6,208,275 and 6,580,378, as well as application Ser. No. 10/462,868 filed on Jun. 16, 2003, have addressed that data transfer process. Although that work was addressed generally to the transfer of data to and from a computer, the methods and apparatus described are equally applicable to processes occurring entirely within a computer. The present invention continues that development and sets out, in one aspect of seeking faster computer operations, another step in the creation of systems by which data can be provided more efficiently, more rapidly, and with less waste of bit space both to/from and within a computer or like device. In this description, a "datum segment" is simply an amount of sequential binary code that represents an item of information.

U.S. Pat. No. 6,208,275, issued to this inventor on Mar. 27, 2001, shows a concatenator that accepts a series of datum segments of a fixed size, such as 8-bit bytes, and then concatenates them together to form larger words of lengths that would be an integral multiple of that fixed size, thereby to yield words of 16, 24, 32 bits, etc. The reason for so doing is that in a computer having, e.g., 32-bit data busses, it is wasteful of space to use such a bus to transmit a datum segment only 8 bits long—24 bit spaces are unused. The '275 concatenator serves to "string together" four 8-bit bytes and then transmit the resultant 32-bit data string, thus to use the full capacity of the bus so that one transmission does what would otherwise have taken four. No data transmission occurs during the actual concentration process, but that gate-based process will ordinarily be much faster than the data transfer, hence there is a net saving of time. Of course, the same principles will apply to other fixed byte or bus sizes such as 64-bit, 128-bit, etc.

U.S. Pat. No. 6,580,378, issued to this inventor on Jun. 17, 2003, sets out a simple data enumerator that counts the bytes on which the concentration process just noted is carried out, and "tags" each such byte with an index number. Those numbers will identify which positions within a destination register will contain which datum segments. When those datum segments are transmitted to a computer, those numbers also aid in recovering the original datum segments from the longer, concentrated data segments in the computer. The nnnnn bit count code is used in the present invention to aid in specifying the starting addresses of successive datum segments in the output register of the apparatus and in the computer or other device to which these data are to be sent, since, when treating variable length datum segments, those addresses will no longer be fixed in advance by a fixed datum segment size.

Application Ser. No. 10/462,868, filed Jun. 16, 2003, describes another method by which bit space can be saved in transmitting and using bit strings, in part by snipping therefrom any leading zeroes that take up space but do not convey any information. A second aspect of the apparatus is that it can treat datum segments of varying length, that might have come about either as a result of that zero-stripping process, or such datum segments may have been provided to the apparatus originally. Included is a general method of forming and using datum segments of varying length, by way of variable length shift register that can yield versions of all of the basic gates of digital electronics, e.g., AND, OR XNOR, etc., that can also be of varying length. By a "variable length" gate is meant that only those bit spaces in a register that correspond in number to the bit length of a datum segment at hand need to be utilized, thus leaving other adjacent bit spaces for other uses. It is one specific purpose of the present invention, that would not otherwise be available, to provide means by which datum segments, fixed-length bytes, identifiable bit sequences or data in any other form under whatever name, that could have been zero-stripped to include only meaningful data bits, can then be processed as such, as a matter of routine, thereby to maximize the data handling capabilities of such a system relative to any other system.

The processes of the Ser. No. 10/462,868 lead to a form of encoding a datum segment as nnnnnddd . . . , where nnnnn, the "bit count code", expresses the number of bits in the datum segment that immediately follows, and the ddd . . . represent the actual bits of the datum segment. That method of expressing the nature of the datum segment comes about firstly by independently establishing the number of bits in the datum segment, which the apparatus of the 'xxx patent carries out. The actual code of the datum segment itself is then established and concentrated onto the bit code nnnnn, using 5 bits as an example. Concentration of this type could be carried out in the apparatus of the 'xxx patent since there, as here, the number of bits "n" used to express the number of bits in the datum segment was fixed, and since the datum segment ddd . . . is concentrated onto the Least Significant Bit (LSB) end of the nnnnn code, the length of the datum segment itself does not affect the concentration process.

An initial address is used for placement of the bit count code nnnnn, itself again having 4 bits, and the first bit of the datum segment is then placed at the address that immediately follows the code nnnnn, i.e., in the example using the 5-bit nnnnn code at the $5^{th}$ register position. It is then necessary only to place that entire bit string into a register large enough to accommodate that entire nnnnnddd . . . code. The reason that the bit count code nnnnn is retained is to permit structuring of the circuitry within the computer to which these data are to be sent.

However, it is not immediately possible in the apparatus of the 'xxx patent to concentrate onto a first nnnnnddd . . . code a second such code, since the end point of that first nnnnnddd . . . datum segment will not be known, except indirectly through knowledge of the nnnnn value that is associated with each datum segment. What is needed is thus a means by which the position of the last bit of a variable length datum segment can be established with the hardware itself, so as not only to carry out concentrations of the form nnnnn+dddddd=nnnnndddddd as is done by the apparatus of the '275 patent, where here "+" means a concentration and "=" means that the result of that concentration then follows, but to concentrate those resultant terms, i.e., in concentration of the form nnnnnddd . . . +nnnnnddd . . . +nnnnnddd . . . =nnnnnddd . . . nnnnnddd . . . nnnnnddd . . . where the number of data bits "d" and hence the length of the datum segment as a whole can vary, and of course the ellipses would no longer be present, but the numbers of "d's" that represent the actual number of bits in each datum segment would be shown instead.

For example, and for brevity using here a bit count code of 4 bits, a resultant code for three datum segments of varying size could come out to be as

01001101110010011001011110011001110101, which is an unambiguous encoding of the result of concatenating a 4-bit and a 12-bit datum segment together, and then concatenating a 9-bit datum segment onto that result, together with the content (selected arbitrarily) of each of them. In the above code, the initial 0100 bit count code identifies a following 4-bit datum segment; the code 1101 is the datum segment itself, the next bit count code 1100 identifies the 12-bit datum segment 100110010111, and the following 1001 bit count code then identifies a 9-bit datum segment which has been given the content 100110101. The present invention will construct an extended series of such variable and unpredictable length datum segments to encompass as much as possible of a data transfer bus and of the registers through which the datum segments may pass.

SUMMARY OF THE INVENTION

A concatenator has as input at least one register that is adapted to receive datum segments of varying length, from 1 bit on up to the full size of the register. The data must either arrive in, or be placed into, the form nnnnnddd . . . , wherein the n's express the number of bits in the datum segment $ds_i$=ddd . . . that follows that nnnnn sequence, and the ellipsis represents a continuing sequence of bits "$d_i$" with the bit count code nnnnn now selected as an example containing 5 bits, so as to express any integer from 1 to 32. The concatenator accepts a series of distinguishable datum segments from within a data stream and transfers those datum segments to a series of pre-determined memory locations within a computer or other data processing system. The efficiency of that transfer is improved by concatenating together as many datum segments as may be, given the sizes of the datum segments that happen to have arrived and the size of the bus on which the data are to be transferred, and hence to transfer as much information as possible in each transmission. These datum segments may or may not have been zero stripped, thus to be shorter in length than would otherwise have been the case.

It would be of particular advantage as to data comprising numbers having widely varying magnitudes, including smaller numbers for which the binary code therefor would contain many leading zeroes, to zero strip such numbers and then concatenate together the results, thus saving bit space both by the zero stripping and by the concatenation. Such a procedure as to both zero stripping and concatenation also has a security aspect, in that if the data were put into the nnnnddd . . . varying length form before transmission, and those data were intercepted in transit or had otherwise fallen into unauthorized hands, any effort to interpret those data (perhaps as 8-bit bytes) in a computer not equipped with the apparatus described herein would yield meaningless results, and the data would remain secure in spite of having been intercepted.

The individual datum segments can arrive sequentially, or two or more such datum segments may arrive simultaneously, from two or more data streams into a corresponding number of variable length registers. (A reason for treating more than one data stream at a time is that the circuitry of the invention is expected to operate much faster than data can be transmitted thereto, so the introduction of a second bit stream would make better use of that circuitry if it did not have to wait for data, and means could be provided to "cycle through" the several bit streams in the old manner of time sharing on main frames.) In the case of the arrival of two or more data streams, the datum segments would still be treated in a pre-determined order, e.g., cycling from left to right in an array of buffers into which the datum segments had been stored on arrival. One of two datum segments, i.e., the first-arriving datum segment if the two datum segments arrived sequentially within a single bit stream, is placed to the left in a variable length output register, and then the second-arriving datum segment, starting with the bit count code that expresses the length thereof, is placed to the right of the last bit of the first datum segment, commencing at the position that immediately follows that last or Least Significant Bit (LSB) of that first datum segment, as determined by the value of nnnnn for that first datum segment. What is involved here is that since that first datum segment might have any length within some particular range, it will not be known in advance where that LSB will arrive and hence where the first bit of the bit count code for the second datum segment is to be placed, and to accomplish that determination so as to place that second and of course all later datum segments at proper places in a final destination for the data as a whole is what this variable length concatenator is to do.

In general, where $ADDRESS_1$ is a starting address given in such number of bits as is needed to express the full size of the registers into which the datum segments are to be placed, the address of the first bit of each later datum segment is given by the sums of the lengths of the preceding "full" datum segments plus 1, where by a "full" datum segment of length $L_i$ is meant the length of the datum segment $ds_i$ itself plus the length of the code by which that length is expressed. That is, the 5-bit length of the bit count code nnnnn that expresses the length of each datum segment, that is then $((nnnnn)_2)_i$, i.e., a code to the base 2 of the length of the $i^{th}$ datum segment, has added thereto the actual value of the datum segment length so expressed, and the address for the start of that bit count code for each such data segment $ds_j$, with respect to a series of concatenations, becomes $ADDRESS_i=ADDRESS_1+\Sigma L_i+1$, where the "i" refer to all of the datum segments of the series up to but not including that last $ds_j$. The length of the bit count code can be fixed with respect to a given instance of the invention, or that code length can be made adjustable so as to be pre-set to a desired value based on the maximum length anticipated for a given body of data to be treated, whereby that bit code length could then be changed to accommodate another particular series of datum segments. By "relevant memory" may mean a block of memory selected out of the full memory capacity of the computer that has been set aside for this data input function, or it may be essentially all of that memory capacity.

"Look-ahead" means are provided for determining whether or not sufficient bit space remains available in the output register of the apparatus for each next datum segment, and if that space turns out to be insufficient, the register content as accumulated to that point will be transferred out therefrom at that time. After that transfer, a new concatenation series is started with that new datum segment then becoming the first datum segment of that new concatenation series, to be placed at the leftward end of that output register.

Selection of the number of bits to be used in designating the lengths of the datum segments to be treated depends only on the lengths of the datum segments one expects to receive, and has no relationship with the length of the output register into which the incoming datum segments are to be accumulated. That is, one could use an "nnnnn" code that would express datum segment lengths only up to 32 bits, as will be done herein, but the output register into which those datum segments are to be accumulated may be 128 bits, 256, or whatever size may be required for the intended uses. Even so, in order to illustrate the case in which concatenation of a next datum segment would exceed the size of the output register, in the example employed herein the size of the output register is also set at 32 bits. The purpose in carrying out the concatenation, after all, is to permit the transfer of as much information in one transmission as possible, hence the register from which each such transfer is to be carried out, and of course the associated transmission means, would be made as large as may be feasible. The register of the datum segment positioner to be seen later in this specification might well be 128 bits, the output registers could be 1 Kb, and the relevant memory in the computer or the like could be measured in Gb, or other examples could be cited as to the needs of other particular cases.

The addresses to which these datum segments are to be sent are calculated from the addresses of preceding datum segments, but if desired, as for example when it is known that a sequence of datum segments to be received will relate to different subjects of interest (e.g., after some known or measurable number of datum segments the data might change from the names of company personnel to their phone numbers, from accounts receivable to accounts payable, from the genes within one chromosome to those in another, etc.), means are provided for introducing a new starting address to form a separate memory block when the datum segments that treat a new subject classification are to begin.

Since the circuitry of the invention may need to treat bit streams arriving from a separate source as through a modem, or data arising from within the same computer, and in either event this circuitry is to transmit its output to some relevant computer memory, the circuitry of the invention is preferably placed physically at a location within the computer that is conveniently near to both such a modem or other input/output device and to the relevant computer memory, and preferably, if possible, on the same printed circuit board (PCB) as that relevant memory, with the modem or like device generally being on its own PCB, each such PCB to be installed in the mother board of the computer in the usual manner. In other words, this present concatenator might best be utilized if fabricated as an enclosure within a large array of memory locations, thereby to take maximum advantage of the concentration of data within that memory that this concatenator provides.

BRIEF DESCRIPTION OF THE SEVERAL VIEWS OF THE DRAWINGS

FIG. 1 (sheet 1) shows the use of a preferred embodiment of the invention, a concatenator into which are fed a series of datum segments i, j, k, . . . of varying bit length.

FIG. 2 (sheet 1) shows in broad outline the basic functions of the concatenator as to the routing, location and distribution of the incoming datum segments of FIG. 1 in terms of a datum segment router and datum segment distributor.

FIG. 3 (sheet 2) shows the application of a first step in the concatenation process to the datum segment router of FIG. 2, in the entry of a first datum segment into an input register.

DETAILED DESCRIPTION OF THE INVENTION

Figure 5:
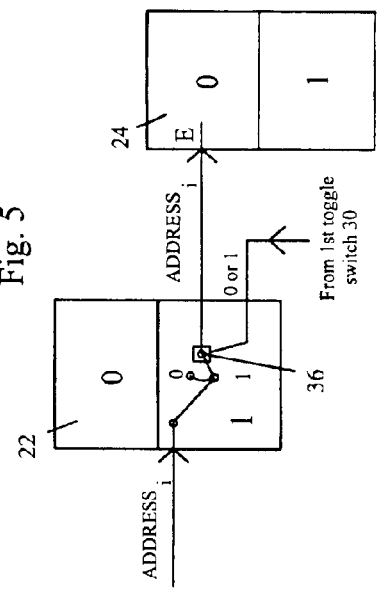
FIG. 5 (sheet 3) shows in more detail a second router and subtractor as shown in FIG. 3.

The broad aspects of the invention as to function are shown in FIG. 1, which depicts concatenator 10, which will be seen to be an asynchronous gate circuit operating in response to data as received, and into which are to be fed a series of datum segments i, j, k, . . . that may have varying bit lengths and are generally expressed in the form nnnnnddd . . . , where "nnnnn" is the binary code for the number of bits $(nnnnn)_2$ in the following datum segment "ddd . . . " If the datum segments to be treated are not initially in the nnnnnddd . . . form, they can be put into that form through the use, e.g., of an instance of the data enumerator of U.S. Pat. No. 6,580,378 that has been configured to count bits rather than bytes, and the concatenator of U.S. Pat. No. 6,208,275, both of which patents are hereby incorporated herein by these references. For reasons of space in the drawings, in the main discussion of this invention herein a register length of 32 bits is described, to which the datum segments must then conform, hence only 5 bits are needed to indicate the bit lengths of those datum segments. Each "d" of the above formula represents a bit, and the ellipsis signifies that more bits may follow after the "d" bit spaces than are actually shown. The bit size of each datum segment could then vary from 1 bit up to 32 bits. As a practical matter, however, those registers could be made as large as may be feasible. That the lengths of the various datum segments will not only vary but also are not known in advance are the reasons why the concatenation of these kinds of variable length datum segments cannot be carried out by the concatenator of the '275 patent, which is adapted only to treat datum segments of some fixed, uniform size.

Concatenator 10 of the present invention thus adds the ability, by way of datum segment router 12 and datum segment distributor 14 as shown in FIG. 2, to concatenate datum segments of varying length. Datum segment router 12 serves the initial function of determining whether or not a newly arrived datum segment can be concatenated as a part of a current series, based on whether or not sufficient bit space is available, or must instead be used to start a new series. In the course of so doing, the precise bit locations where one datum segment ends and a new one can begin are also determined, and then datum segment distributor 14, that will be seen to include a datum segment shifter and a datum segment positioner, serves to place each new datum segment into those locations. In the event a new datum segment cannot be fitted into a current concatenation series, datum segment router 12 also serves to effect the transfer of the content of an existing series to external circuitry such as a computer, thereby to allow commencement of a new series. FIG. 3 shows in block diagram the role of the bit count code nnnnn in the operation of datum segment router 12, and how the datum segment is prepared for transfer to datum segment distributor 14.

While concatenator 10 of the '275 patent shows registers of fixed size into which are fed a series of bytes $b_1, b_2 \ldots$, each of which are also of that same fixed size, as just stated concatenator 10 of this invention employs a variable length input register 12 and a variable length output register 32. "Full" datum segments containing the bit count code nnnnn$_i$ and also the datum segment ds$_i$ itself are placed into input register 12 in the first position thereof; the address of each additional datum segment thereafter is established by calculation from the address of the last of the previous full datum segments, and the datum segments as initially placed in each case into the first positions of input register 12 will ultimately be transferred to the addresses in output register 32 as had just been determined.

For example, for a first datum segment "i" shown in FIG. 1 the "nnnnn" value in the bit count code for the length of the associated datum segment "i" is $(00011)_2$=3. For a next-arriving datum segment "j" the bit count code is $(00111)_2$=7. Concatenation of those two datum segments having different bit lengths in accordance with the invention would yield 00011ddd00111ddddddd, where the d's represent particular "0" or "1" bit values. Onto that 20-bit string 00011ddd00111ddddddd it would be sought to concatenate another datum segment "k" of 12 bits, that with the 5-bit length of the bit count code nnnnn would form the 17-bit datum segment 01100dddddddddddd to yield a complete result of $$00011ddd00111ddddddd01100dddddddddddd. \quad (1)$$

The result of concatenating just those first two datum segments "i" and "j" is shown in the output register at the bottom of FIG. 1, the series of 12 "x's" at the right end positions of that register meaning that no data have been entered therein. That is necessitated because the concatenated result of formula (1) represents a total accumulation of 37 bits, which is 5 bits more than the output register can accommodate, as shown in the "32 bit" bit count arrow of the hypothetical register at the bottom of FIG. 2 that marks off the 32 bits of the actual output register as shown in FIG. 1. Concatenation of that "k" datum segment cannot then be carried out, and only the first two datum segments "i" and "j" can be concatenated together, leaving 12 bits unused in the resultant transmission. These examples have been chosen to show how newly arriving datum segments may or may not be able to be concatenated as part of an ongoing series, as it will be the function of datum segment router 12 of FIG. 2 to determine. Of course, one practical procedure here would simply be to provide a larger output register, but of course that would merely defer the problem to a different register size. Even so, the result shown is still an improvement over sending out these datum segments individually since, for example, a transmission of the first full datum segment of 8 bits by itself would leave 24 bits of the output register unused in that transmission.

With concatenator 10 other purposes can be pursued besides the orderly transfer of data, e.g., the data enumerator of the '378 patent can be incorporated with the circuitry of the invention to count the datum segments as they enter. If those datum segments were words of text, for example, that count could provide a word count of a document, or if those data were the contents of individual sales invoices, the count would yield the number of such sales. Also, in the interest of designing self-testing circuitry, if that data enumerator were accompanied by a clock signal, as would not ordinarily be the case with an asynchronous gate circuit such as concatenator 10, the circuitry could also provide means for measuring the speed of operation of concatenator 10.

What the invention provides as an adjunct, in its ability to place data into the most convenient locations within a computer, is an acceptance and subsequent distribution of data in forms, and having logical structures, that would have been established before those data had even reached the computer, that would then save time in executing READ and WRITE commands or other operations within the computer, rather than having such data be entered into an amorphous memory structure for which the actual addresses that happened to become used had no relationship to the data content. Put another way, instead of allowing incoming data just to stack up in one huge "pile" as in ordinary, non-discriminatory memory systems, this apparatus is adaptable, through the use of a "ttt . . . address prefix, to carry out a pre-sorting of data such that the incoming data can be pre-directed as to destination. In such case the data are tagged for storage in a manner that will be meaningful, with each type of data then being placed in structured stacks or hard drive addresses in a way such as to be physically juxtaposed as to type, and thus be accessible more rapidly for further operations.

Since concatenator 10 accepts datum segments of varying length, the location in the output register into which is to be placed the first bit of each new full datum segment, i.e., the first bit of the bit count code nnnnn$_i$ of that datum segment, must be defined. That is done by pre-selection as to a first datum segment, but can be done thereafter either by pre-selection or, through one major aspect of the invention, by calculation as to later datum segments, that calculation being based on the sizes of successive datum segments as they arrive and are accumulated within an output register. As noted earlier, datum segments of varying length also require a determination of whether or not an arriving datum segment can actually be accommodated by the bit locations left unused in the output register, and both processes are carried out by concatenator 10.

An initial ADDRESS$_1$, that may be the same as an address in some relevant block of computer memory or other circuitry to which the datum segment is to be sent, establishes the placement of the first bit of the bit count code $nnnnn_1$, which then, following the 5 bits of that bit count code $nnnnn_1$ itself, defines the position for placement of the corresponding datum segment $ds_1$. Of course, given that the length of the datum segment is known, as is the length of the bit count code $nnnnn_1$ by which that length is expressed, placement of the first bit of the bit count code automatically fixes the locations of the rest of the bits in the full datum segment, as well as the starting point for the next datum segment.

$ADDRESS_1$ will then arbitrarily be taken to be 00001, while for the corresponding computer address any accessible value, including those that may have been assigned to various nodes within the computer, can be used. That address might be held either as a permanent entry for a particular instance of the invention, or so as to be editable for data classification purposes as noted above, but in either case the value of $ADDRESS_1$ is used to route that first datum segment and then, by adding to $ADDRESS_1$ the full length $L_i$ of that first datum segment, to have defined the address for the bit count code and then the content of the next datum segment, and so on. Through use of that method, each datum segment will be placed in immediate contiguity with datum segments on either side thereof, except, of course, for the first and last datum segments, although even then by rare circumstance the first and last datum segments may be placed in contiguity one with the other, so that all datum segments would be in immediate contiguity with others, and in such case not even a single bit location in the computer would be left unused. In what follows, it is assumed that the number of bits to be used for the bit count code, the value for $ADDRESS_1$, the sizes of the registers, and other parameters that characterize any particular instance of the invention are held in non-volatile memory in the concatenator 10 circuitry, and that on startup those values will be loaded into the places required, subject to any further editing thereof by the user.

FIG. 3 shows datum segment router 12 in detail, within which are contained the input register 16, a first router 18, a first adder 20, a second router 22, a subtractor 24, and a third router 26. (The present discussion treats the processes of concatenator 10 that begin at the data input nnnnnddd . . . into input register 16, with discussion of the preceding circuit elements in FIG. 3 being deferred to later.) It may be noted in FIG. 3 that in input register 16, the first five positions of the full datum segment "i" shown therein, and which constitute the $nnnnn_1$ bit count code for the datum segment $ds_1$, connect directly to the A input terminal of first router 18. The address for the next datum segment, which will be $ADDRESS_2$ for datum segment "j," will be calculated on the basis of the length of that bit count code itself, together with the value of that first bit count code, through the operation of first router 18 in placing the data necessary therefor on first adder 20.

First adder 20 will carry out two additions with respect to each new incoming datum segment. For each of those additions, there must also be two routings carried out by router 18, which are (1) the selection of the appropriat inputs for first adder 20 for each addition; and (2) a routing of the result of each addition. (As will be discussed below, two subtractions will also be carried out in subtractor 24 with respect to each datum segment.) The operations that then take place are described in terms of "0" and "1" "areas" in first router 18 (and in the subsequent circuit blocks), those areas not designating distinct physical structures but rather what the operations will be when one or the other of the "0" and "1" designations, which are in fact addition selection codes, is in effect. Thus, the four inputs that are shown as being connected to first router 18 relate to the "0" and "1" notations within first router 18 by way of their locations, with the single external input A shown entering first router 18 within a "0" area, along with the B entry 00101 that expresses the size of the $nnnnn_1$ bit count code, those two quantities participating in the first addition under a "0" addition selection code; and then the quantities $L_1$ and $ADDRESS_1$ for this first datum segment $ds_1$ similarly being shown at the C and D terminals in the bottom half of first router 18 that contains the "1" addition selection code that brings about the second addition. In the top half of first router 18 labeled "0," the two inputs shown entering that upper half will be those two inputs that will be sent on to first adder 20 on a "0" addition selection code for a first addition. Similarly, when the addition selection code is "1," the two inputs coming from the lower half of first router 18 and connecting to the lower half of first adder 20 will be those that are sent to first adder 20 for a second addition. As will be explained below, which addition selection code is in effect at a particular time is determined by first OR gate 28 and first toggle switch 30 that are also shown in FIG. 3. These processes as to the first datum segment, $ds_1$, are summarized in Table I:

TABLE I (First datum segment)
Addition processes in first adder 20

| First router 18 inputs | First adder 20 output |
|---|---|
| First addition | |
| 1(a) Length of $ds_1$, i.e., $nnnnn_1$ (line A) | 1(a) + 1(b) = $L_1$ to line C of first router 18 |
| + | |
| 1(b) 5-bit length of nnnnn (line B) | |
| Second addition | |
| 2(a) $L_1$ (line C) | $ADDRESS_2$ to second router 22 |
| + | |
| 2(b) $ADDRESS_1$ (line D) | |

The continued course of that process, i.e., as to what is done with the value obtained for $ADDRESS_2$, lies in identifying that particular datum segment of the sequence $ds_i$, $ds_j$, $ds_k$, $ds_l$, . . . for which the corresponding full datum segment lengths $L_i$, $L_j$, $L_k$, $L_l$ . . . total more than the 32-bit size of output register 32. Concatenator 10 thus tests each newly arriving datum segment in that regard. If a newly arrived datum segment will fit into output register 32, it will so be placed as part of the concatenation process then under way, while if it will not so fit, a new concatenation series will be started. With $L_n$ representing each of the full datum segment lengths, if $\Sigma L_n \leq 32$, the last-arriving datum segment can be concatenated onto the pre-existing content of output register 32, but otherwise not, and hence a new concatenation must be started. (For reasons to be given below, the test is not actually carried out on the basis of that sum, but rather on the calculated address for each new datum segment. Either test could be used, and both are deemed to fall within the spirit and scope of the invention.)

A second task of concatenator 10 is to determine the address in the computer, for which $ADDRESS_i$ in concatenator 10 (a "register address") will be a temporary corollary, to which each datum segment will be sent. That computer address will be the same whether or not a datum segment in question can be accommodated within the series of concatenations then being carried out or must be used to start a new series of concatenations. That is, although the location within output register 32 into which a datum segment will be placed for transfer will change when a new concatenation is begun, and will always be the first position on a new concatenation rather than a calculated register address, the computer addresses are cumulative, and the computer address for the next-arriving datum segment must remain the same even though the correlated register address may change—the datum segment will have a register address either of $ADDRESS_1$ or some other value, depending upon whether or not it was used to initiate a new concatenation series, but the computer address to which it will be sent will be the same in either case. Successive computer addresses will continue to increase through whatever number of series of concatenations as may be necessary in order that all of the datum segments will be placed in juxtaposition within the computer as intended. Each datum segment will arrive at a pre-determined computer location, whether into memory or as immediate input to a circuit, regardless of how the concatenations that brought about those transfers were carried out.

To clarify how that result is brought about, there will exist a definable relationship between a particular location in input register 16 and output register 32, with both of these also being related to addresses in the computer. The relationship between output register 32 addresses $ADDRESS_i$ and the computer addresses will change, however, since while input register 16 and output register 32 are used over and over again, as just indicated the ultimate locations in the computer to which data will be sent are cumulative in nature and will be fixed (as to a particular course of operations). In being used over and over again, input register 16 conveys a single datum segment at a time, and starts each new concatenation series at $ADDRESS_1=00001$. Output register 32, on the other hand, although it starts its own set of concatenated datum segments at its own leftmost address, accumulates a number of such datum segments in each concatenation series, and then transmits some number of those accumulated datum segments all at once.

As previously noted, in the examples to be used below datum segment lengths were selected such that the first two datum segments $ds_1$ and $ds_2$ (respectively parts of the full datum segments "i" and "j" shown in FIG. 1) will become concatenated together, but there was not sufficient space in output register 32 for what would have been the third datum segment $ds_3$ (a part of datum segment "k" in FIG. 1) of the series. Datum segment $ds_3$ is thus not concatenated onto the content of output register 32, that content by then having become $ds_1$ and $d_2$, but becomes instead a new $ds_1$ in a new concatenation series, and at that point only the prior $ds_1$ and $ds_2$, or more exactly, the full datum segments "i" and "j," will be transmitted out of output register 32.

The formalism used is that the first bit location of input register 16, i.e., $ADDRESS_1$, is correlated with the computer address, and for ease of discussion as to the very first series of concatenations both the register address $ADDRESS_1$ and corresponding computer address, are given the address 00001. The second datum segment $ds_2$ will have the register address $ADDRESS_2$, which as it turns out will be 01001 for which $(01001)_2=9$, hence the first bit of bit count code $nnnnn_2$ thereof will ultimately be located at that address in output register 32, i.e., at the $9^{th}$ bit location therein that correlates with another specific computer address. Any pre-sorting of these data segments as was noted above would be shown by the fact that if it were desired to store data into, say, a "2000 block" in the computer, the register address of 00001 would correlate with a computer address of 2001, and likewise the register address 9 would correlate with the computer address 2009. More exactly, since the computer addresses will increase continuously, those computer addresses may be of a form even as large (in binary code) as 00000000000000000000000000000001 (4 Gb) or more, etc., i.e., being expressed by a rather larger number of bits so as to accommodate that larger capacity of the computer. That process is not a part of the concatenation process, however, and so is not discussed further here except to note that such process is more naturally carried out by the circuitry to which concatenator 10 connects rather than by concatenator 10 itself. Upon completion of as many concatenations as possible within a first set of 32 bits, in a new concatenation series there will again be a register address $ADDRESS_1$, $ADDRESS_2$, and so on, but the computer addresses to which these addresses correlate will commence where the previous series left off, i.e., at an address that follows the last bit of the last datum segment already treated.

To determine whether or not output register 32 can accept a next-arriving datum segment, it will be necessary to evaluate a sum effectively of the form $\Sigma L_n$ as to each new datum segment, to determine whether or not $32-\Sigma L_n<0$, i.e., whether th bit lengths of the data segments add up to more than the bit length of output register 32, and several different ways of so doing might be used. One way would be to keep a "running count" of the values Li, $Li+L_j$, $Li+L_j+L_k$, etc., and then subtract each such value from the 32-bit size of output register 32. If that calculation yielded a result of <0, the capacity of output register 32 would have been exceeded, and the concatenation of that latest datum segment being considered could not be carried out. (A sum result of $\Sigma L_n=0$ would show that such capacity had been exceeded insofar as a next $ADDRESS_i$ is concerned, even though that for the datum segments alone had not, since it is the bit address next following the bit space taken up by $\Sigma L_n$ that the address test actually to be used seeks to evaluate.)

It should be made clear, however, that a determination that some $ADDRESS_x$ can be accommodated within output register 32 says nothing about whether a corresponding datum segment $ds_x$ that commences at that address could be so accommodated. That $ADDRESS_x$ can be accommodated in output register 32 shows only that the preceding datum segment $ds_{x-1}$ can be accommodated, since $ds_{x-1}$ precedes $ADDRESS_x$ in order. To determine whether or not $ds_x$ can be fitted into output register 32 requires testing of the address that derives from the next datum segment, i.e., by testing $ADDRESS_{x+1}$, which is established both as actual fact and by the test being carried out by the length of the datum segment $ds_{x+1}$.

A second method of determining whether or not a new datum segment could be accommodated in output register 32 could be based on defining $L_M=32$ as the maximum number of bits that output register 32 can accommodate, as in this instance of concatenator 10, wherein the "i" datum segment of FIG. 1 will have the starting address $ADDRESS_i$ in the series $ADDRESS_i$, datum segments "j" and "k" have the addresses $ADDRESS_j$, $ADDRESS_k$, etc., and then test in turn each of the successive addresses $ADDRESS_j$, $ADDRESS_k$, etc., for each of the subsequent datum segments "j," "k," etc., until that address was found that exceeded $L_M$. Which of these or other similar methods to adopt might be decided on the basis of which one requires the least circuitry and hence the least time, or on similar criteria, but as a practical matter, given the nature of subtractor 24 as will be explained below, the method adopted here corresponds to the second of these methods, having given $ADDRESS_1$ the value 00001, and the $L_i$ are then successively added thereto. In light of the general principles set out here, however, the use of any of these or similar such methods would fall within the spirit and scope of the invention, and are deemed to be encompassed by the claims appended hereto.

Figure 4:
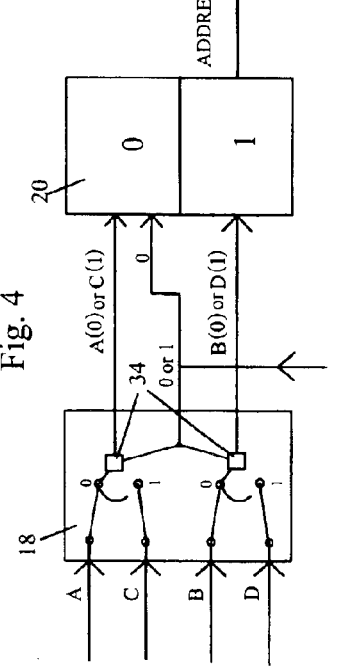
FIG. 4 (sheet 3) shows in more detail a first router and an adder as shown in the circuitry of FIG. 3.

Turning back now to FIG. 3, the interconnections that are in effect when the addition selection code is a "0" or a "1" bit, and the operations that will then be carried out, are shown by the "0" or "1" designations within the respective upper and lower parts of first router 18 and first adder 20. In addition, FIG. 4 shows those connections in more detail, starting with the input connections to first router 18 under each of the "0" or "1" addition selection codes, i.e., to lines A and B for the "0" code and lines C and D for the "1" code, the particular example shown being that for the "0" code. For illustrative purposes only, the vertical positions of lines B and C have been reversed in FIG. 4 from what they were in FIG. 3, so as to show more simply, by the mechanical analog of a double pole, double throw or "DPDT" switch 34, the manner of operation of the switching between the A–B terminal pair for the first addition and the C–D terminal pair for the second addition. The similar "0" and "1" designations in second router 22 and subtractor 24 in FIGS. 5 and 6, which are quite distinct from the addition selection codes in first adder 20, refer respectively to the subtractions to be carried out by subtractor 24 that will be described shortly, and then as to third router 26 either to continuing a concatenation then in process (routing code "0") or to transferring out the content of output register 32 and starting a new concatenation (routing code "1").

The addition selection code designation for the first addition has been arbitrarily selected to be "0," and to start the process for the "i" datum segment of FIG. 1, FIG. 3 shows the bit length $nnnnn_1=00011$ of the first datum segment $ds_1$ (wherein $(00011)_2=3$) in the leftward-most positions of input register 16, followed by the actual 3-bit datum segment $ds_1$. So as to have an entry, $ds_1$ has arbitrarily been given the binary code 010, from which $(010)_2=2$, but that actual content is irrelevant for purposes of the concatenation operation.

As noted earlier, that $nnnnn_1=00011$ value is placed on input line A of first router 18. The length of the bit count code $nnnnn_i$, selected for this instance of the invention to be 5 bits and hence constituting a permanent input, is placed on line B of first router 18. The sum of those two values, i.e., 3+5=8, is the length $L_1$ of this first "full" datum segment in the general format nnnnnddd . . . , with the "full" datum segment "i" itself being 00011010. The above summation is the first addition to be carried out in first adder 20, and comes about by (a) having the addition selection code of "0" on first router 18; (b) the connections resulting therefrom that put 00011 (the length of $ds_i$) on input line A of first adder 20 and 00101 (the length of the bit count code $nnnnn_1$ by which that length of $ds_i$ is expressed) on input line B of first adder 20; and finally (c) the addition selection code "0" itself on first adder 20 so as to bring about the desired addition. Again, the addition of those two numbers yields the full datum segment length $L_1$. More generally, if $L_n$ is the bit length of $nnnnn_i$, here set at 5-bits, then $L_i=L_n+(nnnnn_i)_2$, where the subscript "2" merely means that the preceding binary code is to the base 2.

Those 8 bits are to be placed into output register 32, but it must first be determined whether or not output register 32 has sufficient bit space to accommodate them. For this first datum segment there must necessarily be sufficient space, but the determination thereof is carried through here even so, since it is indicative of the process as to later datum segments, and in any event will so proceed on its own. For that purpose, as seen in FIG. 3, the sum $L_1=00101+00011=01000$ is passed from first adder 20 back to line C of first router 18 as one input for the second addition. That result of that first addition is also passed from first adder 20 into 1-bit first OR gate 28, as a result of which, since that sum code must always contain at least one "1" bit (a method used in the '275 and '378 patents and application Ser. No. 10/462,868), a pulse will pass from first OR gate 28 into first toggle switch 30 so as, through the resultant "toggle" therein, to provide a "1" addition selection code to first router 18 and first adder 20. First router 18 will then switch the connections to first adder 20 to those that are needed to carry out the second addition.

For purposes of that second addition, $ADDRESS_1$ for the first datum segment $ds_1$ is seen in FIG. 3 to be on line D of first router 18. Using $ADDRESS_1=00001$ and the procedure just described, this second addition becomes $L_1+ADDRESS_1=8+1=9$ or 01001, which will be the starting address $ADDRESS_2$ for the next datum segment. Whether or not the series of concatenations then underway can include the next datum segment (i.e., whether or not output register 32 has sufficient space therefor), the $ADDRESS_2$ value just determined is sent to line D of first router 18 to replace the indicated $ADDRESS_1$ value that was just noted to be there, for later use in the second addition as to the next datum segment. That step is shown in FIG. 3 by the "$ADDRESS_2=01001$" notation on the line that extends down from the bottom of first adder 20 towards line D of first router 18. First adder 20 also sends the result of this second addition into first OR gate 28, so that the pulse produced thereby will again cause a "toggle" in first toggle switch 30, so as now to yield a "0" addition selection code. First router 18 will then have been "cycled," i.e., to have been re-configured to carry out the first addition as to the next datum segment.

To determine whether or not output register 32 can accommodate a particular datum segment, a choice of procedure is available. Two subtractions are carried out in subtractor 24, that could be based either on the address of the next-arriving datum segment or on the sum of all of the previous datum segment lengths. If a subtraction test relative to the first datum segment based on the value of $ADDRESS_2$ obtained for the second datum segment $ds_2$ were used, a positive result would indicate not only that the concatenation (or in the case now being discussed of a first datum segment of a series, simply a data transfer) could be carried out, but also that there would remain in output register 32 at least one more bit unused, that would be $ADDRESS_2$ itself. A calculation based on the total length of all preceding datum segments (at the moment only on $L_1$) would indicate with a $32-L_1=0$ result (of course, that is not the present case) that the last bit position of $ds_1$ coincided with bit location 32 of output register 32, i.e., there was just enough space in output register 32 for $ds_1$, but not for $ADDRESS_2$. That would be the most useful result, but the procedure to be adopted here is the former, since the $ADDRESS_2$ value that in any event will be needed otherwise had just been calculated, is readily available, and can also be correlated immediately with the computer address to which the corresponding datum segment will be sent. Even so, which procedure is used, so long as it is internally consistent, is again a matter of design choice, so the use of either procedure would be deemed to fall within the spirit and scope of the appended claims.

The reasons for using the particular values in the subtractions now to be described will be set out below, but for the present it is simply noted that subtractor 24 is configured to carry out two subtractions, the first yielding the value of the quantity $ADDRESS_2-2$ as the subtrahend for the second subtraction, and then the second subtraction $L_M-(ADDRESS_2-2)$, where $L_M$ is the number of bit positions (32) in output register 32. The result of that second subtraction determines whether or not the datum segment being tested will fit into output register 32. By the initial premise that no incoming datum segments would exceed in length the 32-bit size of the concatenator 10 circuitry, there will necessarily be space for datum segment "i" in output register 32, and with the 3-bit length of the $ds_1$ selected here as an example that is clearly the case.

As shown by the terminal designations A, B, C, and D in FIG. 3, the value 01001 of $ADDRESS_2$ (shown in FIGS. 4 and 5 as $ADDRESS_i$) that comes from first adder 20 is sent through second router 22 onto terminal E of subtractor 24. Since the two sums obtained in the two additions in first adder 20 will appear at the same output of an ADD circuit contained therein (of course at different times), but it is only the result of the second addition that is sent to subtractor 24, second router 22 turns out merely to be a simple switch, i.e., address switch 36 as shown in FIG. 5. That is, the result from the first addition with the addition selection code of "0" is disconnected from subtractor 24 by address switch 36, but the result of the second addition under the addition selection code "1," which is $ADDRESS_2$, is sent through address switch 36 of second router 22, and is transmitted to subtractor 24 for the first subtraction therein under a "0" subtraction selection code.

Figure 6:
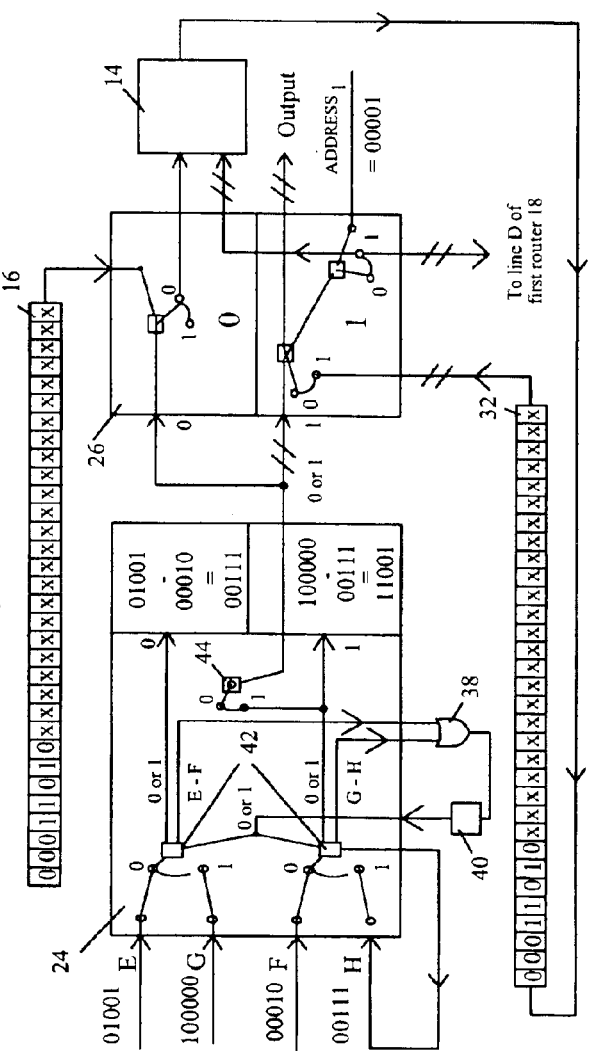
FIG. 6 (sheet 3) shows in more detail the subtracter and third router of FIG. 3.

The 00111 value on the H terminal of subtractor 24 shown in FIGS. 3 and 6 comes from the first subtraction $ADDRESS_2-2=01001-00010=9-2=7=00111$, with the "0" subtraction selection code in effect, as depicted in the upper part on the right in subtractor 24 of FIG. 6. By connection to second OR gate 38, that first subtraction result will yield therefrom a pulse that when sent to second toggle switch 40 to which the output of second OR gate 38 connects will cause second toggle switch 40 to change the subtraction selection code from "0" to "1." The second subtraction that follows is shown in the lower part of subtractor 24 on the right in FIG. 6, i.e., $100000-00111=11001$. Using the procedure previously employed with respect to the additions in first adder 20, the vertical order in which the inputs to subtractor 24 are depicted has been changed in FIG. 6 to "E, G, F, H" instead of the normal order "E, F, G, H" shown in FIG. 2, again in order to show the double pole, double throw ("DPDT") nature of second DPDT switch 42 in subtractor 24, the simple mechanical version of that switch again being used for explanatory purposes only. What is sought from these subtractions is a routing code that will determine whether or not the concatenation series then being carried out can continue so as to include the datum segment being tested.

Since $ds_1$ would precede $ADDRESS_2$ in output register 32, if $ADDRESS_2$ can be fit into output register 32 then so can $ds_1$, but it is also desired that $ds_1$ be transferred into output register 32 whenever possible, even if there were no space for $ADDRESS_2$. To define the test in that fashion, there are two adjustments that need to be made. The first of these derives from the fact just stated, namely, that it is the last bit of the datum segment that must be fit into output register 32, and not the next following bit that would be the address of the next datum segment. If that were the only consideration, the test to determine whether or not output register 32 could accommodate the datum segment under test would be to subtract from $L_M=32$ the quantity $(ADDRESS_2-1)$. However, as will now be shown, it happens that yet another bit must be subtracted from that subtrahend because of the nature of the test that subtractor 24 carries out.

It is convenient here to use a 1's complement subtractor because of one feature that such subtractor type exhibits, the operation of which will be known to those of ordinary skill in the art. The circuitry of this type of subtractor is such that besides the actual subtraction result, it also provides a single bit code, here called a "test bit," that indicates whether or not, in any given subtraction, the minuend was larger than the subtrahend. The test to be applied is whether or not minuend>subtrahend, not minuend subtrahend, and subtractor 24 is configured so as to yield a "0" routing bit if the minuend is larger than the subtrahend, i.e., the first expression just stated is satisfied, and a "1" routing bit if it is not, i.e., that expression is not satisfied. The former "0" result continues the concatenation series then being carried out, while a "1" routing code causes the concatenation series to terminate.

To account for the additional "1" value noted above that will yield the number 2" in the first subtraction, in a case in which factually minuend=subtrahend, then using a minuend$\geq$subtrahend test together with a subtrahend $(ADDRESS_2-1)$, the extreme of that test (in which the calculation was also minuend−subtrahend=0) would identify the last bit position of the preceding datum segment rather than the next-following position, which is $ADDRESS_2$. The result would be affirmative since the resuit minuend−subtrahend=0 satisfies the minuend$\geq$subtrahend test, thus to indicate that the datum segment under test would fit exactly within the remaining bit locations of output register 32. However, as just stated that is not the test that the 1's complement subtractor carries out, which is instead minuend>subtrahend. In order to have that test that the subtractor actually carries out yield that same result as just noted, by the artifice of defining the subtrahend for the second subtraction as $(ADDRESS_2-2)$, or more generally as $(ADDRESSi-2)$, the resultant affirmative test will be that desired, i.e., indicating that a datum segment that has the same number of bits as the number of spaces remaining in output register 32 will indeed fit therein. With that test result the transfer would be carried out as a continuation of the concatenation series then being conducted.

So as to enable that $ADDRESS_2-2$ subtraction to be carried out as the first of the two subtractions, with $ADDRESS_2=01001$ on terminal E of subtractor 24 as shown in FIGS. 2, 5, the quantity $(00010)_2=2$ is provided on input line F of subtractor 24, and with a "0" subtraction selection code in effect the first subtraction $E-F=ADDRESS_2-2=9-2=7$ is carried out, with the 00111 result being placed on input line H of subtractor 24. That $ADDRESS_2-2=00111$ value is then tested in a second subtraction against $L_M=32=(100000)_2$ that is provided on line G of subtractor 24 for the G−H subtraction. The test bit that derives from that second subtraction serves as the "routing code" that will determine whether or not the datum segment then being tested will fit into output register 32. (This routing code is not to be confused with the "0" or "1" subtraction selection code that determines which of the two subtractions is to take place in subtractor 24, and certainly not with the analogous addition selection codes in first router 18.) What the actual numerical result of the second subtraction happens to be is of no interest, but only whether $L_M$ (the minuend), or 32, is larger than the subtrahend, i.e., the quantity $(ADDRESS_2-2)$ or more generally (ADDRESSi−2). Of course, other subtractor circuitry is also available for such purpose and might have been used in an analogous procedure, but any use thereof instead of the 1's complement subtractor type employed here is deemed also to fall within the spirit and scope of the claims appended hereto.

The result of the present G−H subtraction is $L_M$−(ADDRESS$_2$−2)=32−7=25 (11001)$_2$, which is a positive number that would clearly (and obviously) allow the first datum segment ds$_1$ to be concatenated onto the content of, or in the case of this first datum segment merely entered into, both input register 16 and output register 32. As noted above, in this embodiment of the invention subtractor 24 is constructed so that if the second subtraction therein shows that minuend>subtrahend, i.e., $L_M$>(ADDRESS$_2$−2) or equivalently $L_M$−(ADDRESS$_2$−2)>0, subtractor 24 will yield a "0" routing code and the concatenation series will be continued, while a result $L_M$−(ADDRESS$_2$−2)≦0 will yield a "1" routing code and the concatenation series then in process will be terminated, that last-received datum segment being used instead to start a new concatenation series.

To carify further the basis for these calculations, i.e., how concatenator 10 might operate under different circumstances, and specifically to illustrate the case in which a new and different third datum segment ds$_3'$ would exactly fit into the remaining bit positions in output register 32, since $L_1$+$L_2$=8+12=20, at that stage there remain 32−20=12 bit spaces available in output register 32, wherein ADDRESS$_3'$ for that third datum segment ds$_3'$ would still be 21. A full 12-bit datum segment "k" of 5 bits for the bit count code nnnnn$_3'$ and 7 bits for the datum segment ds$_3'$ itself should then fit into output register 32, i.e., in addresses 21, 22, 23, 24, 25, 26, 27, 28, 29, 30, 31, 32. An entry into terminal C of first router 18 of $L_3'$=01100, wherein (01100)2=12, would yield an ADDRESS$_4'$=C+D=12+21=33, which lies one bit beyond the length of output register 32 and hence could not be used. However, when the procedure using the (ADDRESS$_i$−2) subtrahend in the second subtraction is used, whereby the first subtraction in subtractor 24 is E−F=ADDRESS$_4'$−2=31 and that result is placed into terminal H of subtractor 24, the second subtraction thereby becomes G−H=$L_M$−(ADDRESS$_4'$−2)=32−31=1, which is a positive number to produce a "0" routing bit, thus to indicate that while this new, hypothetical ADDRESS$_4'$ will not fit into output register 32, the new, hypothetical full third datum segment ds$_3'$ having 12 bits that immediately precedes ADDRESS$_4'$ will indeed so fit. Concatenation of that 12-bit full datum segment onto the two full datum segments ds$_1$ and ds$_2$ that were already present in output register 32 would then proceed, which is the desired result (in this present illustration) and confirms that the quantity (ADDRESS$_i$−2) evaluated in the first subtraction in subtractor 24 is indeed the proper subtrahend for general use relative to the second subtraction in subtractor 24.

Those subtractions as to the 3-bit first datum segment ds$_1$=010 are shown in detail in FIG. 6, along with the values employed and the switch locations involved. Since it is only the test bit from the second subtraction that actually constitutes the desired routing code, the test bit value obtained from the first subtraction is not sent on to third router 24, there being a second switch shown in FIG. 6 near to the center of subtractor 24, which is routing switch 44, that provides a subtraction test bit output to third router 24 only when the subtraction selection code is "1." The subtraction selection code shown to be in effect at the moment in subtractor 24 in FIG. 6 is "0", both as to the subtraction being carried out and (by routing switch 44) to transmission of that test bit to third router 24, even though the "0" and "1" boxes to the right of subtractor 24 of FIG. 6 show the nature of both subtractions. That is, with routing switch 44 in the "0" position as shown, there is no connection from subtractor 24 to third router 26, since no line is shown to exit subtractor 24 through the "0" portion thereof, but when the subtraction selection code is changed to "1" for the second subtraction, the resultant test bit, that now becomes the routing code and may be either a "0" or a "1" bit, will be sent on to third router 26 and have one or the other of the two effects shown respectively in the upper "0" and lower "1" boxes of third router 26. (As to third router 26 in both FIGS. 3 and 6, it is the "0" routing code that is shown to be in effect, both by the positions of the second DPDT switch 42 and routing switch 44 in third router 24, and by the slashes across various lines in FIGS. 3 and 6 that will later be shown to respond to a "1" routing code.)

With one of the subtraction selection codes "0" or "1" being in effect in subtractor 24, the subtractions are self-executing once the required inputs are provided. Consequently, with a "0" subtraction selection code in place, as best seen in FIG. 6 but also in FIG. 3, the circuitry in subtractor 24 is structured to perform the following for the first subtraction on this first datum segment ds$_1$:

1. Accept ADDRESS$_i$ on line E of subtractor 24 as a minuend;
2. Connect 00010 (where (00010)$_2$=2) to line F of subtractor 24 as a subtrahend;
3. Connect the binary code output 00111 of subtracting 00010 (on line F) from ADDRESS$_i$=01001 (on line E) to line H of subtractor 24;
4. Also connect the binary code output 00111 of subtracting 00010 from ADDRESS$_i$ to second OR gate 38 (shown in FIG. 3);
5. Have the test bit output of this first subtraction disconnected by routing switch 44 from the input to third router 26; and
6. Following this first subtraction, respond to a "1" subtraction selection code arriving from second toggle switch 40 so as to enable a second subtraction.

Upon receiving that "1" subtraction selection code, the second subtraction in subtractor 24 commences, for which the routing circuitry therein will have been switched over to carry out th following:

1. Accept $L_M$=100000 (where (100000)$_2$=32) to line G of subtractor 24 as a minuend;
2. Connect the result 00111 of subtracting 00010 from ADDRESS$_i$ that had been placed on line H of subtractor 24 in step 3 of the first subtraction as a subtrahend;
3. Connect the routing code "0" deriving from the subtraction of (ADDRESS$_i$−2) on line H from $L_M$ on line G to the input of third router 26 using routing switch 44;
4. Connect the actual output of subtracting (ADDRESS$_i$−2) from $L_M$ to second OR gate 38 so as to cause a toggle in second toggle switch 40; and
5. Following this second subtraction, respond to that "0" subtraction selection code from second toggle switch 40 so as to enable any subsequent first subtraction.

The second subtraction $L_M$−(ADDRESS$_2$−2) yields a positive result and hence a "0" routing code, since 32−7>0. In accordance with step 3 of the second subtraction, that "0" routing code is sent to third router 26 to establish that the concatenation is to proceed, as shown in FIG. 6 by the line from routing switch 44 through the subtraction selection code "1" part of subtractor 24 and then to the upper "0" part of third router 26. That is also shown by the fact that the line extending directly across from the subtraction selection code "1" part of subtractor 24 to third router 26, which pertains only when the routing code "1" is in effect, has slashes across it meaning that at that time no connection there is made. The full first datum segment shown in the "i" line of FIG. 1 and also in input register 16 of FIGS. 3 and 6, as a first datum segment of a series, is thus to be transferred ultimately to the leftmost positions of output register 32 as shown at the bottom of FIGS. 3 and 6. Datum segment distributor 14 will be seen below both to effect that transfer to output register 32 and, with respect to later datum segments of a concatenation series, to place each datum segment in the correct positions within output register 32.

Turning back now to the general process, the manner by which $ADDRESS_2$ is obtained, and by extension an $ADDRESS_3$, $ADDRESS_4$, etc., has been explained, but what must still be shown specifically is how $ADDRESS_1$ is acquired. As noted earlier that value is automatically loaded into concatenator 10 at startup, but what must be shown is how $ADDRESS_1$ is acquired when a new concatenation series is started. As shown in FIGS. 3 and 6, third router 26 has $ADDRESS_1$ available in a buffer shown at the lower right in third router 26. Upon receipt by third router 24 of a "1" routing code from subtractor 24, besides carrying out the principal task of transferring the content then present in output register 32 to some circuitry that will transfer those data to a computer, that $ADDRESS_1$ value is also transferred to line D of first router 18, as shown in FIG. 3 by the rightward of the two lines that extend down from the "1" part of third router 24 and then left and up to line D of first router 18, and also in FIG. 6 by the line that points downwardly from the "1" portion of third router 26, thus permitting the initiation of the remainder of the processes previously described. (The two lines just referred to in FIGS. 3 and 6 both have slashes across them, for that reason that those particular drawings were made to illustrate the case of a "0" routing code, while it is the "1" routing code that is now in effect.)

In transferring the first datum segment "i" from input register 16 to output register 32, it might seem necessary to ensure that only the bit string $nnnnn_1 ds_1$ should be transferred to output register 32, i.e., only the 8 bits that make up "i"=00011010. To transfer any more of the content of input register 16 to output register 32 of FIGS. 3, 6 would transfer superfluous x's therewith. However, as the concatenation continues, those bits will be successively replaced with the bit count code for and content of each next incoming datum segment, i.e., $nnnnn_2 ds_2$, $nnnnn_3 ds_3$, and similarly thereafter, before any data are actually transferred out of output register 32. Except perhaps for some few bits at the end, whatever superfluous bits may have been present temporarily in bit locations within output register 32 beyond those of each datum segments already concatenated would be replaced by the following datum segments before the data transfer to a computer, and thus are quite immaterial. When transmitted out from output register 32, such bits would likewise have no effect in the computer to which sent, since the $ADDRESS_1$ value of each new datum segment is correlated with computer addresses, all of the later transfers to that computer will be immediately juxtaposed onto the final LSB end of the previous transfer, again overwriting, but now in the computer itself, any superfluous x's, but perhaps again leaving some few x's at the very end of the full data transfer process to the computer as a whole.

To see further how that occurs, it may be recalled that although the $ADDRESS_i$ values in concatenator 10 "recycle," i.e., each new concatenation series starts with $ADDRESS_1$=00001 (in this example), the corresponding addresses in the computer are cumulative and continue to increase as more datum segments are transferred in, without regard to what may have been the particular concatenation series in which a given datum segment had been contained. The computer address for a new datum segment is determined from the last calculated $ADDRESS_i$ value, and the last-arriving datum segment will be sent precisely to that specific computer address, whether as a part of an ongoing concatenation series or as the first datum segment of a new concatenation series. Thus, although particular transmissions may contain some small number of unused bit spaces, there will be no such gaps in circuit usage within the computer, but only perhaps a small number of bit locations that are left unused after completion of all of the concatenations and subsequent data transfers would have sought to fill the memory of the computer completely. As noted earlier, upon the occurrence of a "1" routing bit, as shown in both FIGS. 3 and 6, specifically by the lines in FIG. 6 that have slashes across them (FIG. 6 having been drawn for the "0" routing bit example), there is a line extending to the right from the right end of output register 32 and then up to third router 26 where a switch, if in the "1" position (not as shown in FIGS. 3 and 6), passes the content of output register 32 to an "output" line.

Further as to treating the data, it was noted earlier that the present circuit provides means both for accepting pre-classified data and for counting the datum segments, and the means for so doing will now be discussed. The distribution of data as to subject matter requires that the desired classifications already be present in the datum segments as received, and that option is shown in FIG. 3 by the "(ttt)" entry in the drawing, where preferably those bits would be placed after the bit count code nnnnn in order to maintain the method of operation described herein. The sorting of the datum segments in accordance with the classifications may be included as one of the functions of datum segment distributor 14, left to be carried out by the circuitry (not shown) that effects the actual datum transfer, or carried out by the target computer. In the later discussion of datum segment distributor 14, circuitry will be shown and described that would carry out that process as part of this concatenator 10. Of course, if a "ttt" code of that fixed size of 3 bits is included in the datum segments as "nnnnntttddd . . . ," either the value of nnnnn must include those 3 bits or the size of nnnnnttt=8 must be used at line B of first router 18 instead of the size of nnnnn alone, nnnnn then giving only the size of $ds_i$.

As to the counting of received datum segments, as shown in FIG. 3 concatenator 10 also includes data enumerator 46, which is seen to be connected in series on the data input line and to include an input concatenator 48, third OR gate 50, and counter 52. Connection is made initially to input terminals of both input concatenator 48 and third OR gate 50, the output of third OR gate 50 then connecting to counter 52 that in turn connects to input concatenator 48. In operation, the "1" bit output of third OR gate 50 that will be produced by the arrival of a datum segment passes into counter 52, the count from which passes into input concatenator 48 in which that count and the datum segment that gave rise to that count by way of that "1" bit from third OR gate 50 are concatenated together. The result of that concatenation will be in the form "yynnnnnddd . . . ," where "yy" is the count and is termed herein an "index number" and "ddd . . . " is the $ds_i$ datum segment content. That concatenated result is shown in FIG. 3 as an output of data enumerator 46 by the arrowed line that extends upwardly therefrom, and can be used either for other purposes or, as noted below, can be used in place of the basic nnnnnddd . . . coding scheme on which the discussion herein has been based. For purposes of space both in FIG. 3 and herein, only two bits "yy" are shown to form that index number, but many more bits might be required to express a count of all of the datum segments that may be expected to be received. Just as is done with the bit count code $nnnnn_i$ of concatenator 10, that index number will be expressed using some fixed and known number of bits, and since that index number will appear as the leftward component of the full, concatenated expression "yynnnnnddd . . . " even though the "nnnnnddd . . . " component (the incoming datum segment itself) will be of unknown length, that component will nevertheless have a known position in a register used as the output of input concatenator 48, and can be concatenated by using a concatenator of the type set out in the '275 and '378 patents. That is, that earlier concatenator only requires prior identification of the starting position of the second data entry thereto, and in concatenating only two datum segments at once the length of that second datum segment is immaterial. That starting position is established in the circuitry by having allocated a fixed number of bits for the first or leftward datum segment, and will be the "yyy . . . y" sequence of whatever fixed length as had been put into the circuit design.

That yynnnnnddd . . . sequence can also be used together with the type code "ttt" noted earlier that can be used to identify the type or subject matter of each particular type of data being treated and, if reset for each ttt type of data, this index number "yy" could be used to count out the number of entries within each type. In the continuous addressing used in the computer itself, the addresses for each data type could also be compartmentalized, whereby $MADDRESS_1$'s would be the first computer address within each memory block as designated to accept data of the particular type ttt, ultimately to yield a complete "yyttnnnnnddd . . . " code. The particular order in which these various elements are assembled is of course quite arbitrary, but the foregoing order is adopted since the assignment of type codes "ttt" must already have been established at the time that the datum segments are received.

In FIG. 3, if it had been decided to use, say, a ttt classification code prior to the bit count code nnnnn as just shown, the bracket on input register 16 by which the nnnnn code is extracted would start not at the first position of input register 16 as shown, but rather at the fourth position therein. Similarly, if it were decided to use the complete "yyttt-nnnnnddd . . . " code throughout the operation of concatenator 10, by entering that bit sequence into input register 16 rather than the nnnnnddd . . . code as previously discussed (and shown in the various figures), that bit count code nnnnn would need to be extracted from whatever position was defined by the total number of bits in the preceding sequence yyttt. It is important to note that this requirement would apply also to the circuitry of, and the manner in which, datum segment distributor 14 will later be shown to bring about the actual datum segment transfer into the output register 32 of concatenator 10.

The purpose in adopting these practices, given the time and commitment of the ALU and other computer circuitry often required to carry out sorting and similar such operations, is to provide data to that computer that merely in the course of being transmitted thereto will already have been organized into logical structures that will be most convenient for use. All of the aforesaid coding variations can be used in the present apparatus with the kinds of minor circuit adaptations (for appending one code or the other, etc.) just discussed, as will be known to persons of ordinary skill in the art, based on the concepts of the '275 and '378 patents, application Ser. No. 10/462,868 and the present disclosure.

So as to track the course of these events, in the steps to be set out below in Table II for the first datum segment "i" it is assumed that what would have occurred just prior to the first event of this concatenation series would have been either an initial startup of the circuit or the transfer of a "1" bit from third router 26. Recognizing that $ADDRESS_1=00001$ is already present at input D of first router 18, as a result either of a startup or that "1" bit, the circumstances that exist prior to the full treatment of a new datum segment in its path to output register 32, and an initial sketch of what will then transpire, are as follows:

a) upon a startup, the bit count code $nnnnn_1$ will not be known initially, but upon entry of the "i" datum segment will be found to be 00011, where $(00011)_2=3$, the number of bits in that first datum segment $ds_1$, and as shown earlier will appear on line A of first router 18 and so remain until entry of the second datum segment $ds_2$ ("j"). As an initial datum segment, however, the "i" datum segment will be concatenated in any event, since the premise here is that no datum segments will be received that exceed the size of the concatenator 10 registers. As noted above and shown below in the Enter-1 row of Table II, if a new concatenation series has come about because of the termination of a previous series, the bit count code for the datum segment then to be treated will already be known, since it would have been the value of that code that determined whether or not a new concatenation series had to be initiated.

b) the size of the bit count code nnnnn, where $(00101)_2=5$, appears on line B* of first router 18, and will be fixed at that value in this instance of the invention, or possibly at an adjusted value if the classification code "ttt" is used (for simplicity in this description that adjustment is not made), wherein the asterisk "*" is meant to indicate that columns in Table II so labeled will have fixed values;

c) the combined length $L_1$ of $ds_1$ and its bit count code $nnnnn_1$, i.e., the length of "i," is not known initially, but will be found in the first addition in first adder 20, for which the addition selection code is shown in Col. Add. as "0," to be $A+B=3+5=8=(01000)_2$ as shown in row Add-1, Column C of Table II, to appear also on line C of first router 18 in FIG. 3, and will so remain until a like addition is made as to the second datum segment ("j");

d) ADDRESS$_1$=00001 is already on line D of first router 18, having been placed there as noted above by third router 26, either upon termination of a preceding concatenation series or upon initial startup, as shown in FIG. 3 in the line that extends down from the "1" portion of third router 26 and then leftward across the bottom of FIG. 3, and will so remain until replaced by ADDRESS$_2$;

e) ADDRESS$_2$ is not known initially, but upon completion of the second addition in first adder 20, for which the addition selection code is shown in the Add-2 row of Table II in Col. Add. as "1," besides appearing as C+D=8+1=9=01001 on line D of first router 18 to replace the ADDRESS$_1$=00001 value already there as shown in the Add-2 row, col. D of Table II, upon being routed by second router 22 will also appear on line E of subtractor 24, and will so remain until replaced by ADDRESS$_3$ by way of a like calculation on the next arriving datum segment;

f) the fixed number (00010)$_2$=2 that as discussed earlier is used to determine whether or not each new datum segment can fit into output register 32 is on line F of subtractor 24 and will so remain;

g) the size of output register 32, which is L$_M$=(100000)$_2$=32, used to calculate whether or not each new datum segment can fit within output register 32, is similarly fixed for the particular instance of the invention, is on line G of subtractor 24 and will so remain;

h) the result of the first subtraction ADDRESS$_2$−2 in subtractor 24, for which the subtraction selection code of "0" is shown in the Sub-1 row of Table II at the Sub. column, is not initially known, but as shown in the Sub-1 row, H column of Table II and also in FIGS. 3 and 6 will become (00111)$_2$=7, and will be placed on line H of subtractor 24; then the result of the second subtraction L$_M$−(ADDRESS$_2$−2)=32−7=25, not shown in FIG. 3 but shown in FIG. 6 and in the Sub-2 row of Table II, col. H, and as shown in the Sub. column to have the subtraction selection code "1," will be placed on line H of subtractor 24 to replace the first value just entered therein, since the same circuitry is used in both subtractions;

i) the premise of Table II is that the routing code will initially be a "1" bit, having just started a new concatenation series using a new datum segment, but after completing the second subtraction thereon at row Sub-2 the routing code will become a "0" bit, indicating that first datum segment ds$_1$=010 will fit into output register 32, hence that "0" bit routing code is sent to third router 26 to bring about the desired consequences of that "0" routing code, which is the transfer of the datum segment in question from input register 16 to output register 32.

The foregoing course of events can be summarized in the following Table II in which the values referred to in the preceding list have been entered in, and in particular the point at which the value for ADDRESS$_2$ is obtained is marked:

TABLE II

| | A | B* | C | D | E | F* | G* | H | Add. | Sub. | Ro. |
|---|---|---|---|---|---|---|---|---|---|---|---|
| | | | | First datum segment | | | | | | | |
| Initial: | ***** | 00101 | ***** | 00001 | ***** | 00010 | 100000 | ***** | 0 | 0 | 1 |
| Enter-1: | 00011 | 00101 | ***** | 00001 | ***** | 00010 | 100000 | ***** | 0 | 0 | 1 |
| Add-1: | 00011 | 00101 | 01000 | 00001 | ***** | 00010 | 100000 | ***** | 0 | 0 | 1 |
| Add-2: | 00011 | 00101 | 01000 | 01001 | 01001 | 00010 | 100000 | ***** | 1 | 0 | 1 |
| Sub-1: | 00011 | 00101 | 01000 | 01001 | 01001 | 00010 | 100000 | 00111 | 0 | 0 | 1 |
| Sub-2: | 00011 | 00101 | 01000 | 01001 | 01001 | 00010 | 100000 | 11001 | 0 | 1 | 0 |

Datum segments beyond the first one, although they will likewise arrive in the leftmost positions of input register 16, must be repositioned before they are placed into output register 32. Description of that process will be deferred, however, until after it is shown how a second and then a third datum segment are treated in accordance with the same procedure as was just described relative to the first datum segment. Table III below is thus just like Table II except in pertaining to the second datum segment "j," and although not discussed in as full detail as was Table II, the locations therein where differences exist between the data in the two tables will be briefly noted, the first of these differences being that Table III has no "initial" row in it since it follows after Table II, Table III then being as follows:

TABLE III

| | A | B* | C | D | E | F* | G* | H | Add. | Sub. | Ro. |
|---|---|---|---|---|---|---|---|---|---|---|---|
| | | | | Second datum segment | | | | | | | |
| Enter-2: | 00111 | 00101 | 01000 | 01001 | 01001 | 00010 | 100000 | 11001 | 0 | 0 | 0 |
| Add-1: | 00111 | 00101 | 01101 | 01001 | 01001 | 00010 | 100000 | 11001 | 0 | 0 | 0 |
| Add-2: | 00111 | 00101 | 01100 | 10101 | 10101 | 00010 | 100000 | 11001 | 1 | 0 | 0 |
| Sub-1: | 00111 | 00101 | 01100 | 10101 | 10101 | 00010 | 100000 | 10011 | 0 | 0 | 0 |
| Sub-2: | 00111 | 00101 | 01100 | 10101 | 10101 | 00010 | 100000 | 11001 | 0 | 1 | 0 |

Figure 7:
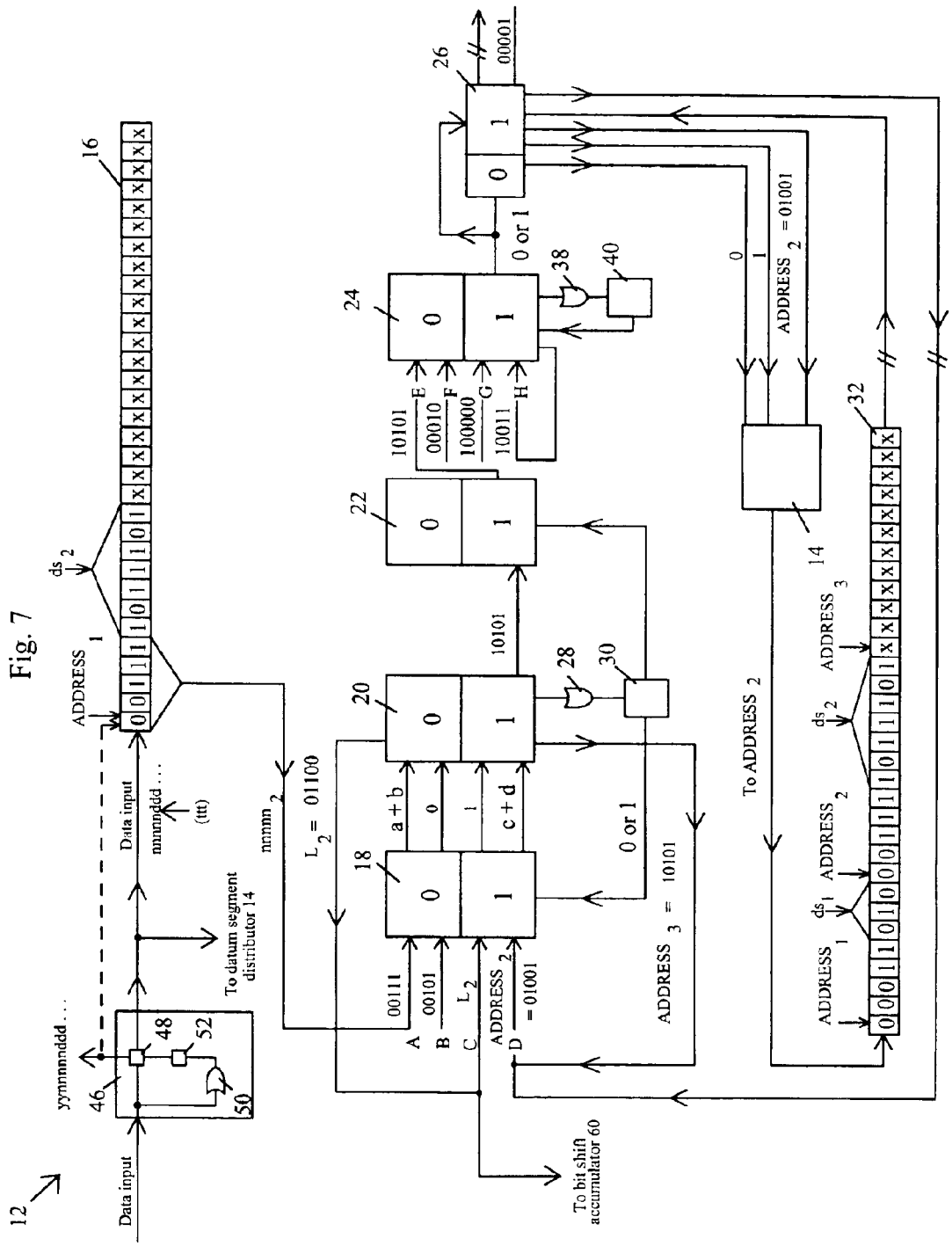
FIG. 7 (sheet 4) shows the process set forth in FIG. 3, except now as to a second datum segment, but that is also of a size to be concatenated within the current series.

The foregoing distribution of these values is also shown in FIG. 7.

From FIG. 1, it can be seen that the second or "j" datum segment has the nnnnn$_2$ bit count code 00111, where (00111)$_2$=7, and hence that figure now appears in the enter-2 row, col. A of Table III, and on the A line of first router 18 in FIG. 7. The content of col. B* will remain fixed, and the rest of the columns in the enter-2 row will retain the respective values previously left there. In the add-1 row, the first (A+B) addition is 00111+00101=7+5=12=01100, which is L$_2$, and appears as such on col. C and on line C of first router 18. Col. D at the add-2 row will be ADDRESS$_3$=ADDRESS$_2$+L$_2$= 01001+01100=10101=9+12=21. In col. H in the sub-1 row, ADDRESS$_3$−2=21−2=19=10011. For the second subtraction G−H=32−19=100000−10011=01101=13, and that positive result will again yield a "0" routing code as shown in row sub-2, col. Ro., and the concatenation series can continue.

Figure 8:
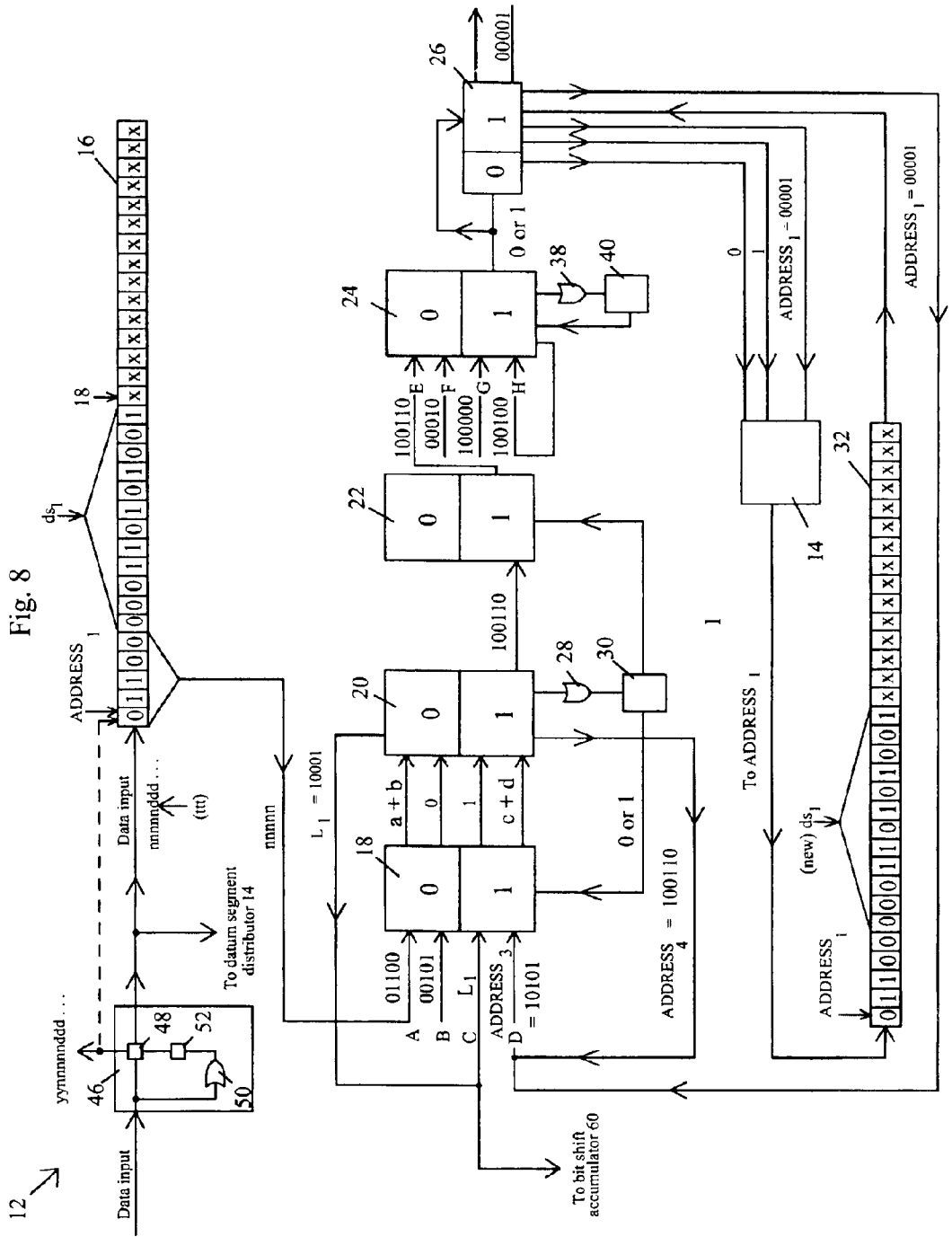
FIG. 8 (sheet 5) shows the process set forth in FIGS. 3 and 7, except now as to a third datum segment that is too long to be contained within the current concatenation series, and hence must be applied instead to start a new concatenation series.

The following Table IV shows the same process as to the third datum segment, which is "k" of FIG. 1, and shows how it is determined that a datum segment turns out to be too long to be concatenated as part of a current series, as is also illustrated in FIG. 8.

must be transferred out to output register 32, and the "k" datum segment on which the aforesaid calculations had just been carried out must instead become the first datum segment of a new concatenation series.

The explicit consequences of having acquired a "1" routing bit can be seen in FIG. 8. From the previous course of events, line D of first router 18 is seen to contain the results of the previous calculation on the second datum segment, i.e., ADDRESS$_3$=10101, and on the line extending downward from the "1" portion of first adder 20, that ADDRESS$_4$=100110 has been calculated and is being sent to replace that ADDRESS$_3$ value. What then follows from having got that "1" routing code, however, is that ADDRESS$_1$=00001 is sent from the "1" portion of third router 26 to that line D of first router 18, and also to datum segment distributor 14, so that the circuitry will now be treating that "k" datum segment as a "new" ds$_1$ that, as shown near the bottom of FIG. 8, to have been transferred as such to output register 32.

Besides determining whether or not each new datum segment will fit into the space remaining in output register 32, the second major task noted earlier is that of positioning the datum segments so as to achieve proper concatenation, wherein each datum segment has its beginning immediately after the end of a preceding datum segment. Datum seg-

TABLE IV

Third datum segment

|  | A | B* | C | D | E | F* | G* | H | Add. | Sub. | Ro. |
|---|---|---|---|---|---|---|---|---|---|---|---|
| Enter-3: | 01100 | 00101 | 01100 | 10101 | 01001 | 00010 | 100000 | 11001 | 0 | 0 | 0 |
| Add-1: | 01100 | 00101 | 10001 | 10101 | 01001 | 00010 | 100000 | 11001 | 0 | 0 | 0 |
| Add-2: | 01100 | 00101 | 10001 | <u>100110</u> | 100110 | 00010 | 100000 | 11001 | 0 | 0 | 0 |
| Sub-1: | 01100 | 00101 | 10001 | 100110 | 10101 | 00010 | 100000 | 100100 | 0 | 0 | 0 |
| Sub-2: | 01100 | 00101 | 10001 | 100110 | 10101 | 00010 | 100000 | −0110 | 0 | 1 | 1 |

The bit count code nnnnn$_3$ for the "k" datum segment is seen in FIG. 1 to be 01100, or 12, and that number is shown in the Enter-3 row of Table IV at col. A, as well as on line A of first router 18 in FIG. 8. Again using th same B* value of 00101, the first addition in the add-1 row yields the result 01100+00101=10001=17, which is L$_3$ and appears both on line C of first router 18 in FIG. 8 and in the add-1 row, col. C of Table IV. Adding to that the previous ADDRESS$_3$ value on line D of first router 18 yields 10101+10001=21+17= 38=100110=ADDRESS$_4$, which as is already evident will exceed the 32 bit location limit of output register 32. (The number of bit locations allocated for the bit count code nnnnn itself is of course fixed at 5, but in calculating other values therefrom, first adder 20 may of course allow an expansion to 6 bits in order to accommodate such overruns.) That ADDRESS$_4$=100110 value will nevertheless be carried through the subtraction processes of subtractor 24 in order to establish the course of events as established by the resultant routing code, which will be "1."

As shown in FIG. 8, ADDRESS$_4$=100110 is entered into line E of subtractor 24, and also appears at the add-2 row, cols. D and E of Table IV, from which the subtraction ADDRESS$_4$−2 at the sub-1 row places the value 100100=36 in col. H thereof, and also on line H of subtractor 24, and then upon the second subtraction, or G−H=100000− 100100=−00100=−4, i.e., a negative number, on the sub-2 row at col. H. That negative result yields a "1" routing code as shown in the sub-2 row, "Ro." col. of Table IV, meaning that the concatenation then in process must be terminated, those datum segments that had already been concatenated ments will all arrive initially in the leftmost positions of input register 16, and the first datum segment will be sent to the leftmost positions of output register 32, but then each subsequent datum segment must be placed at a different address, where by the second datum segment has the address ADDRESS$_2$, the third must arrive in output register 32 at ADDRESS$_3$, and so on. It must now be explained is how that shift in position of a datum segment is brought about.

The method of so doing is to put the datum segment into a shift register and then bring about the number of shifts necessary to place each datum segment as received into the numerical address that follows immediately after each preceding datum segment. Datum segment distributor 14 accepts each new datum segment, that would also be passing through the aforesaid routing process, and based on whether a "0" or a "1" routing bit had resulted therefrom, establish that each particular datum segment is to be in an ADDRESS$_i$ position as a continuation of a concatenation series on a "0" routing bit, or in the first ADDRESS$_1$ position of output register 32 as the first datum segment of a new concatenation series on a "1" routing bit. Datum segment distributor 14 includes circuitry to accomplish that bit shifting, shown in FIG. 9, and also circuitry that will bring about the actual datum segment transfer, as will be described and shown below with reference to FIG. 10.

To accomplish that bit shifting will first require determining the number of bit shifts to be carried out. As can be seen from a review of Tables II–IV, and also by comparing the data shown to be present at the D line of first router 18 in FIGS. 3, 7 and 8, the number of bit shifts required for each new datum segment, since that number depends only on the length(s) of the preceding datum segment(s), will be available in every case from the calculations that had been carried out on each of the preceding datum segments. In particular, given an initial $ADDRESS_1$ and proper tabulation of datum segment lengths thereafter, the amount of bit shifting required for each datum segment will be known in advance, and it is only necessary to extract that information.

Figure 9:
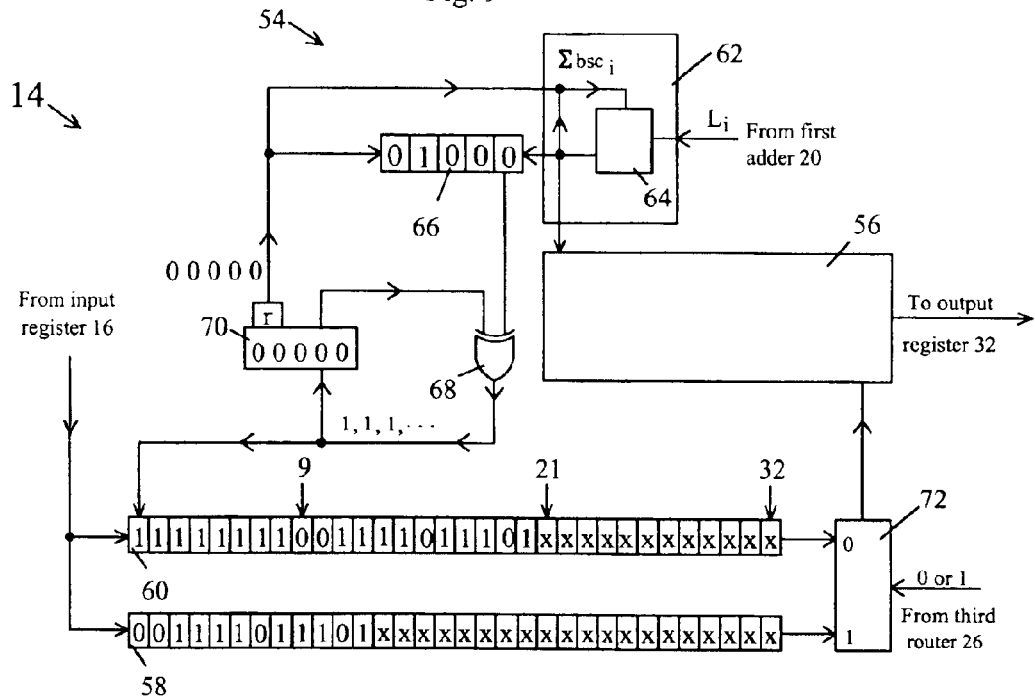
FIG. 9 (sheet 6) shows a bit shifter as part of the datum segment distributor of FIG. 2 that places datum segments into the register locations required for output.

Also, the datum segment in question must have been placed into a location in which it can be bit shifted in accordance with that determination. For the latter purpose, FIG. 9 shows datum segment distributor 14 to include both a bit shifter 54 and a datum segment positioner 56, the latter of which is seen to include holding register 58 and shifting register 60, and into both of holding register 58 and shifting register 60 there is placed a copy of each new datum segment. Shifting register 60 is in fact a shift register, the content of which, as is well known to those of ordinary skill in the art, will be shifted by one bit position therein upon receipt at the MSB end thereof of each "1" bit. The copy of the datum segment in holding register 58 is left in the form as received, while the copy in shifting register 60 is bit shifted by bit shifter 54 in a manner to be described below. The "0" or "1" value of the routing code as determined by subtractor 24 for a particular datum segment will select one or the other version of the datum segment for use, i.e., either by transferring the bit shifted datum segment in shifting register 60 into output register 32 as part of a continuing concatenation process on a "0" routing code, or by moving the non-bit shifted datum segment from holding register 58 into output register 32 on a "1" routing code. An alternative procedure, deemed also to fall within the spirit and scope of the claims appended hereto, would have been to place the datum segment into a shift register only, and then either shift that datum segment or not, depending on whether a "0" or "1" routing code was produced, but the use of two registers as described above allows the bit shifting to be proceeding even as the routing code is being determined. Also, it is evident that in the case of a "1" routing code, the transfer of the datum segment from holding register 58 into output register 32 must not take place until after the pre-existing content of output register 32 has been transferred into the circuitry that will transfer that content to the target computer.

Although it was noted above that every datum segment will be used to calculate a new $ADDRESS_i$ for each next-arriving datum segment, from which the number of bit shifts for that next datum segment can be determined, that information actually comes more directly when the length $L_i$ of the datum segment $ds_i$ and its bit count code $nnnnn_i$ at hand have been determined by the first addition in first adder 20. It is thus that $L_i$ value that is used to count out the number of bit shifts required for a datum segment that is to be concatenated as part of a current concatenation series. Consequently, besides being used to determine the address of the next datum segment and the routing code for the datum segment at hand, that $L_i$ value is also copied into datum segment distributor 14 so as to determine the number of bit shifts required.

There are two aspects of this bit shifting process that must be carefully noted. The first of these is that the length $L_i$ of a particular datum segment that has just arrived pertains not to the bit shifting of that datum segment itself, but rather to that of the next following datum segment. Secondly, it is only with respect to the bit shifting of a third datum segment in a series that the length $L_i$ of the preceding datum segment alone will yield the proper number of bit shifts. That is, the location of the third datum segment depends only on the bit shifting of the second datum segment, there having been no bit shifting of the first datum segment. The fourth datum segment, however, must be placed at a location just after the sum of the bit shifts of the second and third datum segments, and so on. Thus, in general the number of bit shifts applicable to the $i^{th}$ datum segment, i.e., the bit shift count $bsc_i$, can be expressed as $bsc_i = \Sigma L_{i-1}$, i.e., the sum of the lengths of all of the preceding datum segments and their bit count codes (which of course is 5 in every case). Or put another way, $bsc_{i-2} = bsc_{i-2} + L_{i-1}$, i.e., to obtain the bit shift for the $i^{th}$ datum segment, the length of the immediately preceding datum segment and its bit count code is added on to the number of bit shifts that had previously been carried out for all of the preceding datum segment(s). The latter expression above describes directly and exactly how the final bit shift value is actually obtained.

Specifically, it can be seen in bit shifter 54 as shown in FIG. 9 that an $L_i$ value from first adder 20 is placed into bit shift accumulator 62, specifically into second adder 64 therein, which then connects on to shift count register 66. On the output side of second adder 64 there is a second line labeled "$\Sigma bsc_i$," which line turns back to serve as a second input to second adder 64. Using the lengths $L_i$ of the datum segments "i," "j," and "k" of FIG. 1 and beginning with "zero" values on the two inputs to second adder 64, entry of $L_1 = 01000$ into second adder 64 will place that same value into shift count register 66, there having been a zero value on the second input to second adder 64, but by virtue of that $\Sigma bsc_i$ line that 01000 value will also become a second input to second adder 64. The second datum segment will then need to undergo the indicated 8 bit shifts to be placed properly in output register 32, i.e, starting at the $9^{th}$ position therein, just past the last bit of the first datum segment, as shown in shifting register 60 of FIG. 9. Upon the arrival of the second datum segment "j" for which $L_2 = 01100$ or 12, second adder 64 will yield the sum $(01000)_2 + (01100)_2 = (10100)_2 = 8 + 12 = 20$, the number of bit shifts required for the third datum segment "k," thereby (if continued concatenation were possible) to place that third datum segment "k" so as to start at position 21, as is also marked in shifting register 60 of FIG. 9, and the same process will continue as to subsequent datum segments so long as that concatenation series can be continued.

As noted in the earlier discussion, however, the length of the third datum segment "k" precludes it from being included in the concatenation series that includes datum segments "i" and "j," with datum segment "k" having a length of 17 bits, it will fit into input register 16 and both holding register 58 and shifting register 60 upon its arrival, but upon being bit shifted 8+12=20 times in shifting register 60, the bits at the LSB end of datum segment "k" will be "pushed off" the LSB end of shifting register 60. That will not matter, however, since the fact that datum segment "k" will not fit into the space remaining in output register 32 will be signaled by a "1" routing bit from third router 26, and hence it will not be that bit-shifted version of datum segment "k" in shifting register 60 that is transferred to output register 32 in any event, but rather the unshifted datum segment "k" in holding register 58, and indeed, as will be described below in the discussion pertaining to datum segment positioner 56, into the $ADDRESS_1$ positions of output register 32 to start a new concatenation series.

However, that step alone will not resolve the matter of proper treatment of the datum segment that will be next to follow. The several additions and subtractions that occur in the circuit path from first router 18 to third router 26 will already have taken place when that "1" routing code is acquired, and the various values deriving from those calculations, which are appropriate only to the case of a continuing concatenation, will nevertheless have been entered into the various terminals involved, and particularly into bit shift accumulator 62. Those values derive from calculations based on what would have been a third datum segment of that series, with the number of bit shifts required then pertaining, of course, to what would have been a fourth datum segment of that series, when the situation actually existing is that th putative "third" datum segment has instead become a first datum segment, and the putative fourth datum segment has become a second datum segment, with the former situation having present a number of accumulated bit shifts that do not apply to what has become the real situation.

Specifically, upon the entry of datum segment "k" into input register 16, the bit count code $nnnnn_i$=01100=12 thereof would have been entered into line A of first router 18, the length of the bit count code itself, or 00110=5 would have been added thereto in the first addition in first adder 20, and an $L_i$ value=10001=17 would have been entered both into line C of first router 18 and bit shift accumulator 62 to establish in part the number of bit shifts to be applied to the next datum segment. Moreover, the cumulative $L_i$ values for the first and second datum segments, or 8+12=20, would have been added thereto in second adder 64 so as to yield a total bit shift of 37 for the next (or fourth) datum segment. However, when that third "k" datum segment comes to be treated as it must—not as the third datum segment of a continuing series but rather as the first of a new series—and is thus placed into $ADDRESS_1$, the number of bit shifts appropriate to the next-received datum segment, i.e., what will now have become the second datum segment of that new series, will be only the full length of that "k" datum segment so as to be concatenated onto the end thereof, i.e., only by those 17 bits and not by any prior accumulation of earlier bit shifts. The appearance of that "1" routing bit must then be applied also to the entry only of that 17-bit figure into both shift count register 66, for purposes of counting out the correct number of bit shifts, and into datum segment positioner 56 wherein only those 17 bit shifts will correctly position that next-arriving datum segment.

The means for accomplishing that step is provided as a part of the bit shifting process itself. It has been noted that the correct bit shift value of 17 shifts for the next-following datum segment has already been placed, as usual, at terminal C of first router 18 and at the input to bit shift accumulator 62. To avoid including in the bit shift count the number of bit shifts that had already taken place, it is only necessary to prevent the occurrence of that "$\Sigma bsc_i$" addition in second adder 64, so that the correct 17 bit value will pass directly into shift count register 66. For that purpose, it would be possible to add another router to the circuit such that second adder 64 was simply "routed around" on a "1" routing bit, and that procedure would of course fall within the spirit and scope of the invention. However, as indicated above a more simple method of accomplishing that purpose can be found within the bit shifting process itself, as will now be described.

As shown in FIG. 9, bit shifter 54 contains therein XOR gate 68, one input of which derives from shift count register 66, with the other input coming from second counter 70. XOR gate 68 will provide a "1" bit at any time that the two inputs thereto have different values, but a "0" bit if those inputs are the same. The output from XOR gate 68 connects to shifting register 60 and also to second counter 70. A "1" bit from XOR gate 68 will cause a "1" bit shift in the content of shifting register 60, and also a one count increment in second counter 70, which process will continue until the content of second counter 70 has passed from an initial default value of 00000 to match the content of shift count register 66 to produce then a "0" bit from XOR gate 68, rather than a "1" bit, and the bit shifting process will have ended. The 01000 value shown in shift count register 66 is the $L_i$ value from bit shift accumulator 62 expressing the length of the full first datum segment "i," as then pertains to the bit shifting of the second datum segment. At end of the bit shifting, the content of shifting register 60 will be as shown in FIG. 9, i.e., the second datum segment as received (and as still shown in holding register 58) will still be present in shifting register 60, but will have been shifted to the right by 8 positions, thereby to commence at the $9^{th}$ position as required for proper transfer into output register 32.

In more detail, at startup or on the completion of a concatenation series, both shift count register 66 and second counter 70 will have default values of 00000. That is brought about by the fact that the end of a bit shifting process is signaled by a "0" bit from XOR gate 68, that will cause a reset of second counter 70 back to its 00000 reset value, and the line extending from the "r" box on second counter 70 shows that the same 00000 value is sent to shift count register 66. That is, a "0" bit will be produced from XOR gate 68 both in having 00000 values in both shift count register 66 and second counter 70 and (in this particular case) in having 01000 values in both shift count register 66 and second counter 70. Or, more generally, a "0" bit from XOR gate 68 will appear at the end of any bit shifting process as to any datum segment, at such time as second counter 70 has counted out that number of bit shifts as shift count register 66 had indicated was required. Bit shifting is started by the entry of a bit shift count $bsc_i$ into shift count register 66, and more specifically in the present case, as shown in FIG. 9, by entry of $bsc_2$=01000, which again is the value of $L_1$, the length of datum segment "i." Given that the default value of 00000 from second counter 70 is present on the other input to XOR gate 68, a "1" bit will be produced by XOR gate 68, a series of which are shown on the line that extends downward and then to the left from the XOR gate 68 output, and that process will be repeated until, upon repeated receipt of "1" bits from XOR gate 68, the count in second counter 70 has passed from 00000 to 01000 and those 8 bit shifts have been carried out as previously described.

Besides the fact that a new concatenation series begins with a first datum segment to which no bit shifting is applied, it is also true that as to that concatenation series there would also have been no bit shifting of any preceding datum segments. The way in which that fact is reflected, i.e., wherein the various data entries previously mentioned that would have been developed in the course of deriving a "1" routing bit from third datum segment "k" are not included in setting the bit shifts of the new concatenation series, is not by routing around the "$\Sigma bsc_i$" addition in second adder 64, as was noted above as being one possibility, but rather by resetting the input to second adder 64 to reflect the actual number of prior bit shifts that had already been carried out, which of course is zero when treating the second datum segment of a new concatenation series. The line from the "r" portion of second counter 70 that resets the content of shift count register 66 to 00000 is thus sent also to second adder 64.

The value of 17 bits as the length Li of datum segment "k," that has now become the first datum segment of the new concatenation series, still remains as an input to bit shift accumulator 62, but when passed through second adder 64 to have the value of zero added thereto retains that same, correct value as to the number of bit shifts to be applied to a next-arriving datum segment, e.g., as to an "l" datum segment following after that "k" datum segment. As to additional datum segments that can be included within the concatenation series then being carried out, the number of bit shifts for the third and later datum segments would derive from the addition of the real bit shifts that would have been carried out, e.g., as $(L_1)+L_2$; $(L_1+L_2)+L_3+\ldots$, etc., where the term in parentheses would be the value brought back around into second adder 64 by the "$\Sigma bsc_i$" line, to which would be added the bit count comprising the length of each immediately prior-received datum segment, thus to place each successively new datum segment immediately adjacent the preceding one, i.e., at places further and further down along output register 32 until as many datum segments as output register 32 could then accommodate had been included.

While the bit shifting of a datum segment is proceeding, that datum segment would also have been getting processed through the circuitry of FIG. 3 to yield from third router 26 either a "0" or a "1" routing code that determines from which of holding register 58 or shifting register 60 that datum segment will be copied into output register 32. As shown in FIG. 9, that routing code is passed into fourth router 72 that connects to both of holding register 58 and shifting register 60, the content of one or the other of which, as will be determined by the "0" or a "1" value of the muting code, is then passed by fourth router 72 into datum segment positioner 56. Since in the present example the second datum segment "j" will indeed fit within the remaining space of output register 32, fourth router 72 will receive a "0" routing code from third router 26, the content of holding register 58 is left undisturbed until replaced by the next arriving datum segment, while the bit shifted content of shifting register 60 as shown in FIG. 9 will be passed into datum segment positioner 56, the operation of which will now be described.

Figure 10:
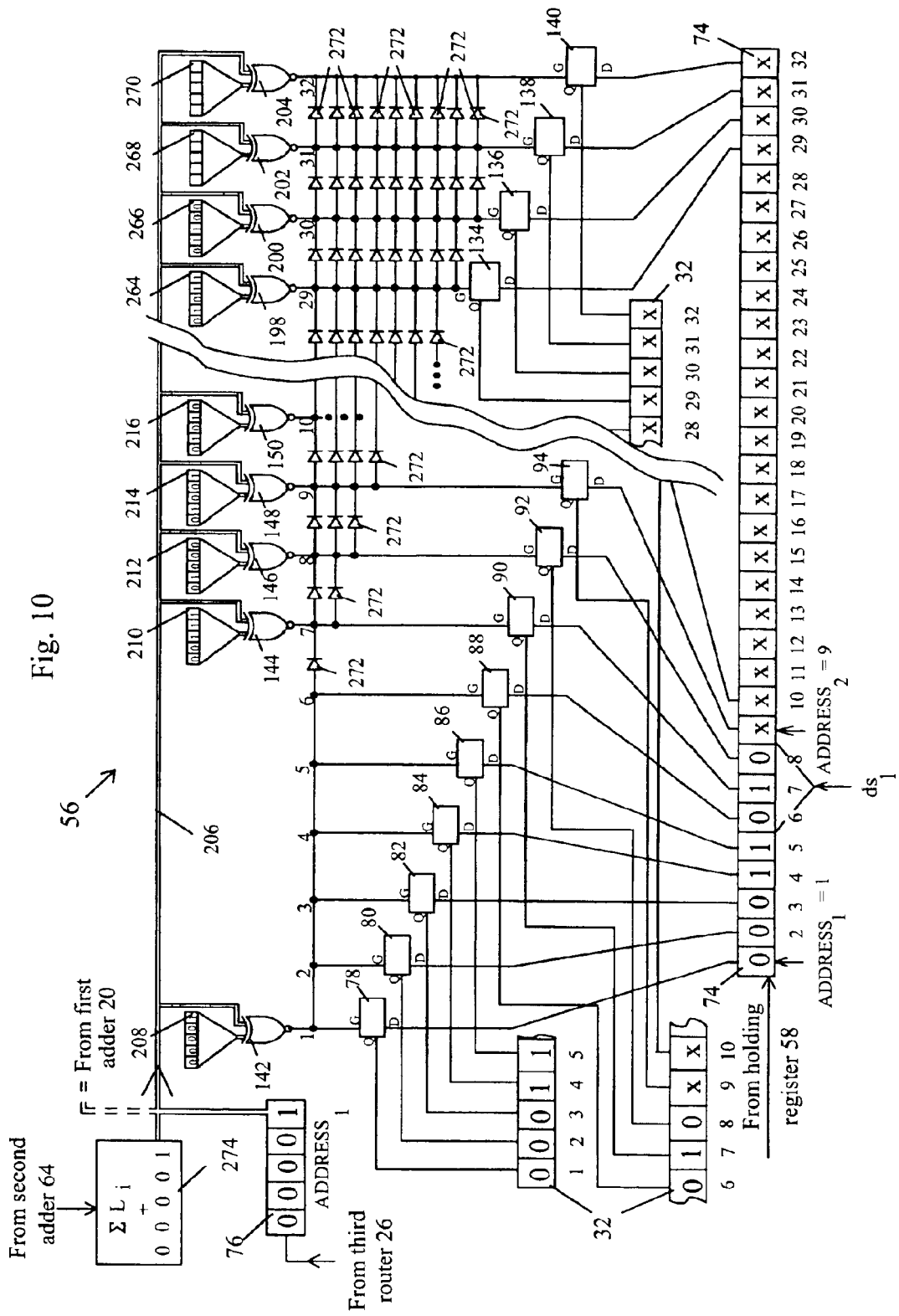
FIG. 10 (sheet 7) shows a datum segment positioner as part of the datum segment distributor of FIG. 2 that accomplishes the actual transfer of datum segments.

Besides needing to determine the number of bit shifts required to place a datum segment into the desired end-to-end relationship with adjacent datum segments and then to bring about that bit shifting, both of which are done by bit shifter 54 as just described, it is also necessary to effect that actual placement of the datum segment in output register 32, and that is done by datum segment positioner 56 shown in detail in FIG. 10 (sheet 7). FIG. 10 is drawn here to represent the case in which a first datum segment is being transferred, for which there will be no bit shifting and it is the content of holding register 58 that will be used. Across the bottom of FIG. 10 there is shown a transfer register 74 into which, in general, there will be transferred the content either of holding register 58 or shifting register 60, depending upon whether the routing code is "0" (shifting register) or "1" (holding register). It would be possible not to use transfer register 74, such that the register shown across the bottom of FIG. 8 was itself either holding register 58 or shifting register 60, but by having transfer register 74 in the circuit, the complex circuitry of FIG. 10 in which every bit position is connected to a latch needs to be implemented only once, rather than for both holding register 58 and shifting register 60. The use of transfer register 74 is adopted here also for purposes of easier description, it being understood, of course, that either way of discussing the procedure, and whether or not transfer register 74 is used, would fall within the spirit and scope of the claims appended hereto.

In the datum segment transfers discussed so far, it would have been the full content of a register that was moved into some other register. What must be accomplished by datum segment positioner 56, however, is the transfer of only a portion of the content of a register, specifically transfer register 74, into output register 32, and in such a way as not to overwrite whatever datum segment content might already have been placed into output register 32. The method of so doing is based on the $ADDRESS_i$ of the particular datum segment. As will be seen further below, on a "0" routing code datum segment positioner 56 transfers out the data in transfer register 74 that is located in positions starting at a particular $ADDRESS_i$ and then on to the right to the LSB end of the register, but data lying on the MSB or left side of $ADDRESS_i$ are untouched. The data present in those last-mentioned locations will in fact be a series of "1" bits that would have arisen from the bit shifting that had placed the datum segment of interest to commence at $ADDRESS_i$. The data already contained in output register 32 on the MSB side of $ADDRESS_i$ are necessarily also left untouched, which is precisely the desired result since those data would be made up of one or more datum segments that had already been transferred into output register 32, and the data transfer that actually does take place concatenates the new datum segment onto those already present, which is the basic purpose of concatenator 10.

FIG. 10 illustrates the circumstances of transferring a first datum segment "i" having $ADDRESS_1=00001$, so datum segment positioner 56 must also be provided with that address. As can be seen in the upper left hand corner of FIG. 10, and also in one of the lines in FIG. 3 that extends down from the "1" portion of third router 26 to datum segment distributor 14, in the case of the first datum segment address register 76 within datum segment positioner 56 will receive $ADDRESS_1$ from third router 26. (It may be recalled that the "0" and "1" portions of third router 26 are not structures, but instead show what occurs when either the "0" or "1" routing code is in effect; the two lines from respective "0" and "1" portions of third router 26 being in fact the same line, and will transmit either the "0" or the "1" routing code as can be seen to be entering third router 26 from subtractor 24.) As will be described further below, a datum segment that yields a "1" routing code from subtractor 24, that is sent to third router 26 at the termination of a concatenation series just prior to the condition now being described, will also have put $ADDRESS_1=00001$ onto that address register 76. Together with the transfer of previously concatenated datum segments out of output register 32 and the placement of $ADDRESS_1=00001$ also on line D of first router 18, it is that entry of $ADDRESS_1=00001$ onto address register 76 of datum segment positioner 56 that brings about the transfer of data from output register 32 to an external computer or other such destination.

For reasons of space in FIG. 10, and to able to show the individual connections from transfer register 74 to corresponding positions in output register 32, output register 32 is set out in separate parts at several places within the drawing of datum segment positioner 56, it being understood, however, that in its actual physical form, output register 32 will preferably be the usual single contiguous unit in the same manner as is input register 16, transfer register 74, or any other register. Datum segment positioner 56 itself is shown in two parts, with a middle part of the full range thereof from 1 to 32 that is not directly involved in treating first datum segment "i" not being shown.

The structure of datum segment positioner 56 centers firstly on an array of 32 datum release latches 78–140 through selected ones of which are to pass the respective contents of the 32 bit locations in transfer register 74 that connect to respective D terminals of datum release latches 78–140, with the 32 Q output terminals of datum release latches 78–140 then connecting respectively to the 32 bit locations of output register 32. Secondly, the selection of the bits actually to be transferred is accomplished by an array of XNOR gates 142–204, the outputs of which connect respectively to the G terminals of datum release latches 78–140. The inputs to XNOR gates 142–204 consist of a common 5-bit address bus 206 as one input thereto, and a second input comprising an array of 5-bit address buffers 208–270 that contain in order the respective 5-bit binary codes for the integers 1–32 and connect individually and respectively to each of the XNOR gates 142–204. A "1" bit will be produced directly at the output of any XNOR gate 142–204 into which address bus 206 provides a 5-bit code input that matches th value in an address buffer 208–270 that connects to that same XNOR gate.

Additional connections between the output sides of XNOR gates 142–204 and the G terminals of datum release latches 78–140 are such that upon entry onto address bus 206 of the binary code for any one of the numbers 1–32, a "1" bit will appear on the output side not only of the XNOR gate to which was connected the same binary code as was present on a corresponding one of the address buffers 208–270, but also on the output sides of every other XNOR gate for which the binary numbers serving as one input thereto are larger than the binary number that had been entered. Thus, it can be seen in FIG. 10 that the output sides of XNOR gates 142–204 are numbered from 1 to 32, and when the binary code for any one of those integers 1 to 32 is entered onto address bus 206, a "1" bit will appear not only on the output side of that XNOR gate which has that same integer number 1 to 32, but in addition, because of the one-directional closed circuit provided by diodes 272 that connect rightwardly from each XNOR gate output to the output of each adjacent XNOR gate output, on the output sides of such of those XNOR gates that have integer numbers larger than that one integer. Those "1" bits will appear on the G terminals of the corresponding array of datum release latches 78–140, thereby permitting transfer of data bits from corresponding positions in transfer register 74 to similarly corresponding positions in output register 32. Transfer of the data from transfer register 74 only into those desired positions within output register 32, i.e., so as not to disturb the desired data already present on output register 32, is brought about by the fact that, because of the directionality of diodes 272, and as opposed to XNOR gates having integer values larger than that which was entered onto address bus 206, that "1" bit does not appear on the outputs of the XNOR gates that have smaller integer values than the value entered. Consequently, the bit on the one selected position of transfer register 74, and all data at positions to the right thereof in FIG. 10, will be transferred to output register 32, but no data at positions to the left of that selected position in FIG. 8 will be transferred.

To see more specifically how that result is achieved, attention may first be drawn to the horizontal line in FIG. 10 extending from just below XNOR gate 142 (XNOR gate no. 1 in terms of the number designations) all the way over to the right side of FIG. 10. Between the G terminals of the first through sixth datum release latches 78, 88 there are solid connections, hence a "1" bit on the output of XNOR gate 142 would appear in the same fashion on the G terminals of all of datum release latches 78, 80, . . . 88 in the left center of the drawing. Entry of the 00001 code (or in fact any code in the range 00001–00110 or 1–6) on address bus 206 will thus place that "1" bit onto the G terminals of the first six datum release latches 78–88 that individually interconnect specific locations along transfer register 74, shown across the bottom of FIG. 10, with corresponding locations in output register 32, the relevant parts of which are shown in the lower left part of FIG. 10.

That procedure clearly accomplishes transfer of the 5 bit nnnnn$_i$ bit count code for the first datum segment, but it may be wondered why connection is also made to the 6$^{th}$ position. That is answered by considering what is the lowest possible address that could be used for the second datum segment. In order to have a second datum segment, there must first have been a first datum segment, which must contain therein at least one bit. That one bit would occupy the 6$^{th}$ position, which then establishes the limitation that ADDRESS$_2 \leq 7$. (Since the first datum segment in this example has 3 bits, it turns out actually that ADDRESS$_2$= 01001=9.) Moreover, because of the right-ward pointing diodes 272 that interconnect respective positions 6–7; 7–8; 8–9; etc., a "1" bit at the 1–6 positions will also appear at all of the rest of the positions to the right therefrom, i.e., at positions 7–32 (the outputs of XNOR gates 144–204). As to the first datum segment "i" in particular, FIG. 10 shows the eight bits 00011010 thereof to have been transferred into the first eight positions of output register 32, as is desired, and as also shown in a complete representation of output register 32 at the bottom of FIG. 3.

Proper placement of later datum segments, however, will require not only having both rightward reaching and electrically conductive lines leading from each XNOR gate output to the next adjacent outputs of the XNOR gates located at higher numbered positions, but also means for ensuring that whatever may be written into an ADDRESS$_x$ in output register 32 does not write over what might previously have been written therein for the previous datum segment starting at ADDRESS$_{x-1}$, and likewise for any earlier datum segments. Both of those tasks are accomplished by that array of diodes 272 that connect between all adjacent XNOR gate outputs beyond the first six, since diodes 272 have a directional orientation that will permit the transfer of a "1" bit to the right in FIG. 10 so as to encompass all of the higher numbered datum release latches, but to block any transfer to the left, that if allowed to occur would encompass the lower numbered datum release latches. The exclusion of that "1" bit from those lower numbered datum release latches prevents any overwriting of previous datum segments that had already been placed in output register 32.

The manner just described in which the locations for the bit count code nnnnn$_1$ and the consequent placement of the datum segment are treated is thus unique to the first datum segment of a concatenation series. Again, in this example the number of spaces required for that bit count code will always be five, since the instance of concatenator 10 selected here as an example was given that size, and of course a corresponding size for input, output registers 16, 32 of 32 bits, given that a 5-bit code can express the integers from 1 to 32. The actual implementation of that 5-bit limitation is precisely at this point, i.e., in the fixed connections to those datum release latches 78–88 that control the inputs to the 61 ft-most positions of output register 32.

In the transfer of later datum segments of a concatenation series for which the routing code will be "0," each such datum segment will have its own ADDRESS$_i$ that must be correctly placed within datum segment positioner 56 in order to yield the proper positioning within output register 32. The required ADDRESS$_i$ value to be applied to transfer register 74 for the datum segment at hand is obtained in the same way as was the number of bit shifts that were required to place that same datum segment in proper condition for such transfer into transfer register 74. That is, there will be no bit shifting of a first datum segment, but then the bit shifting of the second datum segment is based on the length $L_i$ of the first datum segment, as described with reference to FIG. 9. It is thus convenient to derive the required $ADDRESS_i$ value from the same context of FIG. 9 as was the number of bit shifts, thereby ensuring that there will be no interference with other usage of such $ADDRESS_i$ values, i.e., in determining routing codes. It is further shown in FIG. 9 that each successive bit shift count, upon adding the number "1" (or more exactly, $ADDRESS_1=00001$) thereto, will yield the correct $ADDRESS_i$ value that at the particular time is to be used in transferring that same bit shifted datum segment out of transfer register 74 into output register 32—it is the length $L_i$ of the immediately preceding datum segment that controls both processes, such that $ADDRESS_2$ derives from $L_1$, $ADDRESS_3$ derives from $L_2$ (or more exactly, from $L_1+L_2$), etc. The address source for the unique case of $ADDRESS_1$, that is shown in FIG. 10 to be third router 26, for the $ADDRESS_i$ of all other datum segments will instead be bit shift accumulator 62. Since shift accumulator 62 contains not addresses, however, but datum segment lengths Li, the actual $ADDRESS_i$ for the subsequent datum segments must be obtained by adding "1" to that accumulated datum segment length value, and that is accomplished by third adder 274 in datum segment positioner 56 that connects between bit shift accumulator 62 and address register 76. (For example, the bit shifting that must be applied to the second datum segment is 8 in number, but $ADDRESS_2=9$.)

To illustrate how a first datum segment that had previously been transferred into output register 32 will be left undisturbed by later transmissions thereto, an input on address bus 206 of the address 00111, wherein $(00111)_2=7$, would cause a "1" bit to appear at the output of the XNOR gate that connects to that $7^{th}$ position address bus 206, i.e., XNOR gate 144. That could occur, of course, only if the first datum segment had but one bit, and hence with its 5-bit bit count code $(00001)_2=1$ had filled only the first 6 positions of input register 16. Appearance of the aforesaid "1" bit on the G terminal of datum release latch 90, that is directly connected to that output of XNOR gate 144, would then cause the content of the $7^{th}$ position on transfer register 74, which connects to the D terminal of datum release latch 90, to appear on the Q output of datum release latch 90 that connects to the $7^{th}$ position of output register 32. Because of the rightward connection from the output of XNOR gate 90 to the right-oriented diode 272 and thence to the output of the adjacent XNOR gate 92, that "1" bit will also appear on the G terminal of datum release latch 92, thereby allowing the content of position 8 on transfer register 74 to pass through datum release latch 92 to the $8^{th}$ position on output register 32. Similarly, the continuing rightward connection of diodes 272 to successively next adjacent XNOR gate outputs then causes all of the remaining rightward content of transfer register 74 to be transferred to output register 32.

However, because of the rightward orientation of diodes 272, and especially the diode 272 that lies between positions 6 and 7, that "1" bit at position 7 is not felt on the G terminal of datum release latch 88 that connects to position 6 (and thence to positions 1–5) of transfer register 74, so there will be no change in the content of the $6^{th}$ position of output register 32, nor of the content of the $1^{st}$–$5^{th}$ positions. Whatever may be the content of a new datum segment, given the bit shifts that would have occurred on the content of transfer register 74 for all datum segments other than the first, the second datum segment will be transferred into those positions in output register 32 that commence with the $7^{th}$ position. The same will apply to the entry of any $ADDRESS_i$ larger than 7 (either in lieu of or following thereafter), i.e., if transfer is to occur at all, those data bits that are held at or in higher numbered positions in transfer register 74 than any particular $ADDRESS_i$ will be transferred therefrom to output register 32, and none will be transferred to any lower-numbered positions, whose previously transferred content in output register 32 will remain intact.

With specific reference now to the second datum segment "j," the first 8 positions in transfer register 74 would have contained the first datum segment 00011010, but after bit shifting and transfer, second datum segment "j" will instead appear in transfer register 74 as 11111111001111011101, having been bit shifted past those first eight positions into which would have been placed instead the eight "1" bits from the bit shifting process. That is, the full content of output register 32 will appear as 00011010001111011101xxxxxxxxxxxx, where the x's may either be left over from a previous concatenation series or may be a default entry of a zero-string 000000000000 upon startup. The content of the first datum segment will remain, and will not be replaced by those 8 "1" bits arising from the bit shifting process, because the transfer of the second datum segment only begins at $ADDRESS_2=9$.

Alternatively, an $ADDRESS_2$ and later such $ADDRESS_i$ values can be obtained for use in datum segment positioner 56, for the aforesaid datum segment positioning purposes, from the output of the second addition in first adder 20, as these are established as each new datum segment arrives as shown in FIGS. 3 ($ADDRESS_2$), 7 ($ADDRESS_3$) and 8 ($ADDRESS_4$), etc. This option is shown in FIG. 10 by the dashed lines leading into address bus 206.

Although the invention has been described in terms of ordinary electronic digital gates embodied in semiconductor technology (but substituting mechanical switches for purposes of illustration when that seemed to make a description more clear), it should be recognized that the circuit structures and overall architecture of the invention do not depend upon any specific technology. Implementation of the invention could as well be based on other kinds of hardware to form the necessary binary logic, even including, for example, carbon nanotube transistors as described by Ali Javey, Jing Guo, Qian Wang, Mark Lundstrom & Hongjie Dai, "Ballistic Carbon Nanotube Field-Effect Transistors," NATURE, Vol. 424, Issue No. 6949, pp. 654–657 (7 Aug. 2003); the kind of gates formed of magnetoresistive elements as described in A. Ney, C. Pampuch, R. Koch & K. H. Ploog, "Programmable Computing With a Single Magnetoresistive element," NATURE, Vol. 425, Issue No. 6957, pp. 485–487 (2 Oct. 2003); semiconductor light sources and fiber optics using photon transmissions, or, in a quantum computing context, controllable quantum dot interchanges using electron spin for the "0" and "1" bits. Implementation of the invention using these or other technologies, whether presently known or yet to be conceived and demonstrated, are deemed also to fall within the spirit and scope of the present invention and of the claims appended hereto. More particularly, in lieu of datum segment positioner 56 as described and shown herein for purposes of placing datum segments into desired positions in an output register there might be used the data selector 40 and data release latch 42 of U.S. application Ser. No. 10/462,868, filed by the present inventor on Jun. 16, 2003, having the title "Gate-Based Zero-Stripping and Varying Datum Segment Length and Arithmetic Method and Apparatus," and which is incorporated herein by this reference and serves the purpose, as does datum segment positioner 56, of placing datum segments that have undergone some previous processing into some set of previously identified register addresses. (In lieu of the system in datum segment positioner 6 that employs diodes 272 to separate those datum release latches that are to pass data therethrough from those that are not, data selector 40 and data release latch 42 of U.S. application Ser. No. 10/462,868 uses selectable direct connections through an array of datum release latches between input and output registers.) That datum segment distribution procedure, and other variations of other particular methods and apparatus described herein that in such cases would be known to a person of ordinary skill in the art, are similarly deemed to fall within the spirit and scope of the present invention, which must be interpreted only by the claims appended hereto.

It should also be noted that the data produced by concatenator 10 will be unreadable by any computer or other data processing system that has not been adapted to treat variable length datum segments, e.g., by transforming such data as derive from concatenator 10 into some predetermined fixed length as may be used by a particular computer or data processing system. The reason is that standard data processing systems use Central Processing Units (CPUs) or at least processors, that are designed to accommodate "bytes" of some fixed size. From concatenator 10, however, instead of receiving bit strings of a corresponding length such processors could receive within, say, one 16- or 32-bit address, a number of datum segments other than one, one datum segment and part of a second, just a part of one datum segment, and so on, and any attempt to interpret those data by fixed size means would generally yield only gibberish. Concatenator 10 can thus function also a hardware-based computer security device.

The design and construction of other variations in the forms of the electronic, light or other components than those already mentioned herein, and in the particular selection of components, could easily be carried out by a person of ordinary skill in the art, based on the present description of the manner of so doing and the functions being accomplished, hence all such variations are deemed to fall within the spirit and scope of the invention and of the claims appended hereto. Other arrangements and dispositions of the aforesaid or like components, the descriptions of which are intended to be illustrative only and not limiting, may also be made without departing from the spirit and scope of the invention, which must be identified and determined only from the following claims and the equivalents thereof.

I claim:

1. A concatenator adapted to receive and process datum segments of varying bit lengths, comprising:

an input register having a predetermined bit length and having defined therein an initial input register address;

means for receiving within said input register one or more datum segments that may have varying bit lengths;

means for determining the full bit length of one or more received datum segments;

an output register having a predetermined bit length and having defined therein an initial output register address;

transfer means for transferring a first datum segment from said input register to said initial output register address as a first step of a concatenation series;

address calculation means for calculating respective addresses for one or more datum segments other than said first datum segment;

concatenation means for transferring, as further steps of a concatenation series, one or more additional datum segments from said input register into locations within said output register that are in immediate juxtaposition with respective datum segments just previously transferred thereto;

means for determining whether or not a received datum segment can be fit within said predetermined bit length of said output register at locations not occupied by any prior transferred datum segments; and concatenation initiation means for initiating a new concatenation series upon one of said additional datum segments exceeding in length an amount of said predetermined length of said output register not occupied by one or more prior transferred datum segments;

whereby said output register can be filled to near said predetermined bit length by concatenating together a series of datum segments.

2. The concatenator of claim 1 wherein each of said datum segments has appended thereto a bit count code that is of a predetermined bit length and expresses the bit length of said datum segment, and said means for determining the full bit length of one or more received datum segments comprises means for reading said bit count code and adding together said predetermined bit length of said bit count code and said bit length of said datum segment.

3. The concatenator of claim 1 wherein said address calculation means comprises address addition means wherein a full bit length of a received datum segment is added to an immediately preceding output register address.

4. The concatenator of claim 1 wherein said means for determining whether or not a received datum segment can be fit within said predetermined bit length of said output register at locations not occupied by any prior transferred datum segments comprises subtraction means in which a calculated output register address is subtracted from said predetermined bit length of said output register.

5. The concatenator of claim 1 further comprising bit counting means for determining the length of a datum segment and appending thereto a bit count code that expresses said length of said datum segment.

6. The concatenator of claim 1 further comprising bit shifting means for positioning a datum segment and bit count code at a predetermined address in a register.

7. The concatenator of claim 5 wherein said bit shifting means comprises a shift register.

8. A datum segment positioner adapted to accept variable length datum segments each having associated therewith a specific register address to which said datum segment is to be sent, and to place individual ones of said datum segments into respective ones of said specific register addresses, comprising:

address identification means, wherein as to each said datum segment said datum segment positioner identifies said specific register address that is associated with each said individual datum segment; and datum segment transfer means wherein each said individual datum segment is transferred to corresponding ones of said specific register addresses that are associated with each said individual datum segment.

9. A method of concatenating a series of datum segments comprising the following steps:

a) in a first transfer, transferring from a first register having a predetermined length, into an initial address within a second register having a predetermined length, a first datum segment having a predetermined length as defined by an end bit location that is less than said predetermined length of said first register, together with the full remaining content of said first register;

b) in a second transfer, transferring from said first register a second datum segment, together with the full remaining content of said first register, into a second address that begins within said second register at a bit location immediately following said end bit location of said first datum segment, whereby a portion of said first full remaining content as had been transferred into said second register in said first transfer is over-written by said second transfer;

c) repeating steps a) and b) until said second register is essentially filled with consecutively concatenated datum segments.

10. The method of claim 9 wherein said second address is determined by adding to said initial address the predetermined length of said first datum segment.

* * * * *